US010790412B2

(12) United States Patent
Chao et al.

(10) Patent No.: US 10,790,412 B2
(45) Date of Patent: Sep. 29, 2020

(54) LIGHT-EMITTING DEVICE AND MANUFACTURING METHOD THEREOF

(71) Applicant: EPISTAR CORPORATION, Hsinchu (TW)

(72) Inventors: Yen-Tai Chao, Hsinchu (TW); Sen-Jung Hsu, Hsinchu (TW); Tao-Chi Chang, Hsinchu (TW); Wei-Chih Wen, Hsinchu (TW); Ou Chen, Hsinchu (TW); Chun-Hsiang Tu, Hsinchu (TW); Yu-Shou Wang, Hsinchu (TW); Jing-Feng Huang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/259,410

(22) Filed: Jan. 28, 2019

(65) Prior Publication Data

US 2019/0157507 A1 May 23, 2019

Related U.S. Application Data

(60) Division of application No. 15/412,759, filed on Jan. 23, 2017, now Pat. No. 10,236,413, which is a (Continued)

(51) Int. Cl.

*H01L 33/22* (2010.01)
*H01L 33/00* (2010.01)
(Continued)

(52) U.S. Cl.

CPC ............ *H01L 33/22* (2013.01); *H01L 33/005* (2013.01); *H01L 33/007* (2013.01); (Continued)

(58) Field of Classification Search

CPC ..... H01L 33/22; H01L 33/005; H01L 33/007; H01L 33/0095; H01L 33/12; H01L 33/20; (Continued)

(56) References Cited

U.S. PATENT DOCUMENTS 6,784,462 B2 8/2004 Schubert
8,143,636 B2 3/2012 Lin et al.
(Continued)

FOREIGN PATENT DOCUMENTS

CN 102044613 A 5/2011
CN 102222760 A 10/2011
(Continued)

*Primary Examiner* — Dzung Tran

(74) *Attorney, Agent, or Firm* — Muncy, Geissler, Olds & Lowe, P.C.

(57) ABSTRACT

A manufacturing method of a light-emitting device includes steps of: providing a substrate with a top surface, wherein the top surface comprises a plurality of concavo-convex structures; forming a semiconductor stack on the top surface; forming a trench in the semiconductor stack to define a plurality of second semiconductor stacks and expose a first upper surface; forming a scribing region which extends from the first upper surface into the semiconductor stack and exposes a side surface of the semiconductor stack to define a plurality of first semiconductor stacks; removing a portion of the plurality of first semiconductor stacks and a portion of the concavo-convex structures trough the region to form a first side wall of each of the first semiconductor stack; and dividing the substrate along the region; wherein the first side wall and the top surface form an acute angle $\alpha$ between thereof, $30° \leq \alpha \leq 80°$.

20 Claims, 15 Drawing Sheets

Related U.S. Application Data continuation-in-part of application No. 15/299,754, filed on Oct. 21, 2016, now Pat. No. 10,069,037, which is a continuation-in-part of application No. 14/691,221, filed on Apr. 20, 2015, now Pat. No. 9,548,420.

(51) Int. Cl.
*H01L 33/12* (2010.01)
*H01L 33/20* (2010.01)
*H01L 33/10* (2010.01)
*H01L 33/16* (2010.01)

(52) U.S. Cl.
CPC .......... *H01L 33/0095* (2013.01); *H01L 33/12* (2013.01); *H01L 33/20* (2013.01); *H01L 33/10* (2013.01); *H01L 33/16* (2013.01); *H01L 2933/0091* (2013.01)

(58) Field of Classification Search
CPC .. H01L 33/10; H01L 33/16; H01L 2933/0091
USPC .......................................................... 257/79
See application file for complete search history.

(56) References Cited

U.S. PATENT DOCUMENTS 8,637,888 B2 1/2014 Hodota et al.
9,443,903 B2 9/2016 Bergmann et al.
9,705,034 B2 7/2017 Matsumura et al.
9,991,424 B2 6/2018 Im et al.
2002/0117677 A1* 8/2002 Okuyama ......... H01L 21/02573 257/94
2003/0010971 A1 1/2003 Zhang
2004/0135166 A1 7/2004 Yamada et al.
2005/0168992 A1 8/2005 Hirose
2006/0081869 A1 4/2006 Lu et al.
2006/0118803 A1 6/2006 Lee
2007/0246700 A1 10/2007 Park
2008/0116472 A1 5/2008 Tsunoda
2008/0121910 A1 5/2008 Bergmann et al.
2008/0157109 A1 7/2008 Hon
2009/0098343 A1 4/2009 Arena et al.
2009/0256159 A1 10/2009 Lin et al.
2010/0035068 A1 2/2010 Lammel
2010/0096657 A1 4/2010 Ou
2010/0123153 A1 5/2010 Lin et al.
2010/0176418 A1 7/2010 Muraki
2010/0308355 A1 12/2010 Hsieh
2011/0073894 A1 3/2011 Chu et al.
2011/0108872 A1 5/2011 Kim
2011/0175056 A1 7/2011 Cho et al.
2012/0049151 A1 3/2012 Zhang
2012/0061694 A1 3/2012 Shen et al.
2012/0107589 A1 5/2012 Fujino et al.
2012/0117677 A1 5/2012 Knerr
2012/0119243 A1 5/2012 Kim et al.
2012/0138980 A1 6/2012 Kuo
2012/0187423 A1 7/2012 Tsai
2012/0235204 A1 9/2012 Hodota et al.
2012/0261687 A1 10/2012 Shim et al.
2013/0069095 A1 3/2013 Hodota
2013/0126919 A1 5/2013 Yamasaki et al.
2013/0153920 A1 6/2013 Sugawara
2013/0260490 A1 10/2013 Shatalov
2013/0277684 A1 10/2013 Araki
2013/0307002 A1 11/2013 Ko et al.
2013/0328102 A1 12/2013 Peng et al.
2014/0048831 A1 2/2014 Fujino
2014/0110664 A1 4/2014 Lo et al.
2014/0134765 A1 5/2014 Chen
2014/0145227 A1 5/2014 Hoppel
2014/0209859 A1 7/2014 Cha
2015/0060923 A1 3/2015 Park
2015/0214424 A1 7/2015 Fudeta

FOREIGN PATENT DOCUMENTS

TW 200739958 A 10/2007
TW 201322482 A 6/2013
TW I458122 B 10/2014

* cited by examiner

LIGHT-EMITTING DEVICE AND MANUFACTURING METHOD THEREOF

REFERENCE TO RELATED APPLICATION

This application is a divisional application of U.S. patent application Ser. No. 15/412,759, filed Jan. 23, 2017, which is a continuation in-part application of U.S. patent application Ser. No. 15/299,754, filed Oct. 21, 2016, which is a continuation in-part application of U.S. patent application Ser. No. 14/691,221, filed Apr. 20, 2014, the contents of which are hereby incorporated by reference in the entirety.

TECHNICAL FIELD

The disclosure relates to a light-emitting device, and more particularly, to a light-emitting device comprising a light-emitting stack and a textured substrate comprising micro-structures, and the manufacturing method thereof.

DESCRIPTION OF BACKGROUND ART

Light-emitting diode (LED) is widely used as a solid-state light source. Light-emitting diode (LED) generally comprises a p-type semiconductor layer, an n-type semiconductor layer, and an active layer between the p-type semiconductor layer and the n-type semiconductor layer for emitting light. The principle of the LED is to transform electrical energy to optical energy by applying electrical current to the LED and injecting electrons and holes to the active layer. The combination of electrons and holes in the active layer emits light accordingly.

SUMMARY OF THE DISCLOSURE

A manufacturing method of a light-emitting device includes steps of: providing a substrate with a top surface, wherein the top surface comprises a plurality of concavo-convex structures; forming a semiconductor stack on the top surface; forming a trench in the semiconductor stack to define a plurality of second semiconductor stacks and expose a first upper surface; forming a scribing region which extends from the first upper surface into the semiconductor stack and exposes a side surface of the semiconductor stack to define a plurality of first semiconductor stacks; removing a portion of the plurality of first semiconductor stacks and a portion of the concavo-convex structures trough the region to form a first side wall of each of the first semiconductor stack; and dividing the substrate along the region; wherein the first side wall and the top surface form an acute angle $\alpha$ between thereof, $30° \leq \alpha \leq 80°$.

A manufacturing method of a light-emitting device includes steps of: providing a substrate with a top surface, wherein the top surface comprises a plurality of concavo-convex structures; forming a semiconductor stack on the top surface; forming a trench in the semiconductor stack to define a plurality of second semiconductor stacks and expose a first upper surface; forming a scribing region by a first laser dicing from the first upper surface to define a plurality of first semiconductor stacks; etching a portion of the plurality of first semiconductor stacks trough the scribing region to form a first side wall of each of the first semiconductor stack; and dividing the substrate by a second laser dicing along the scribing region, wherein a second laser beam of the second laser dicing focuses in the substrate; and wherein the first side wall and the top surface form an acute angle $\alpha$.

DETAILED DESCRIPTION OF THE PRESENT DISCLOSURE

First Embodiment

Figure 1:
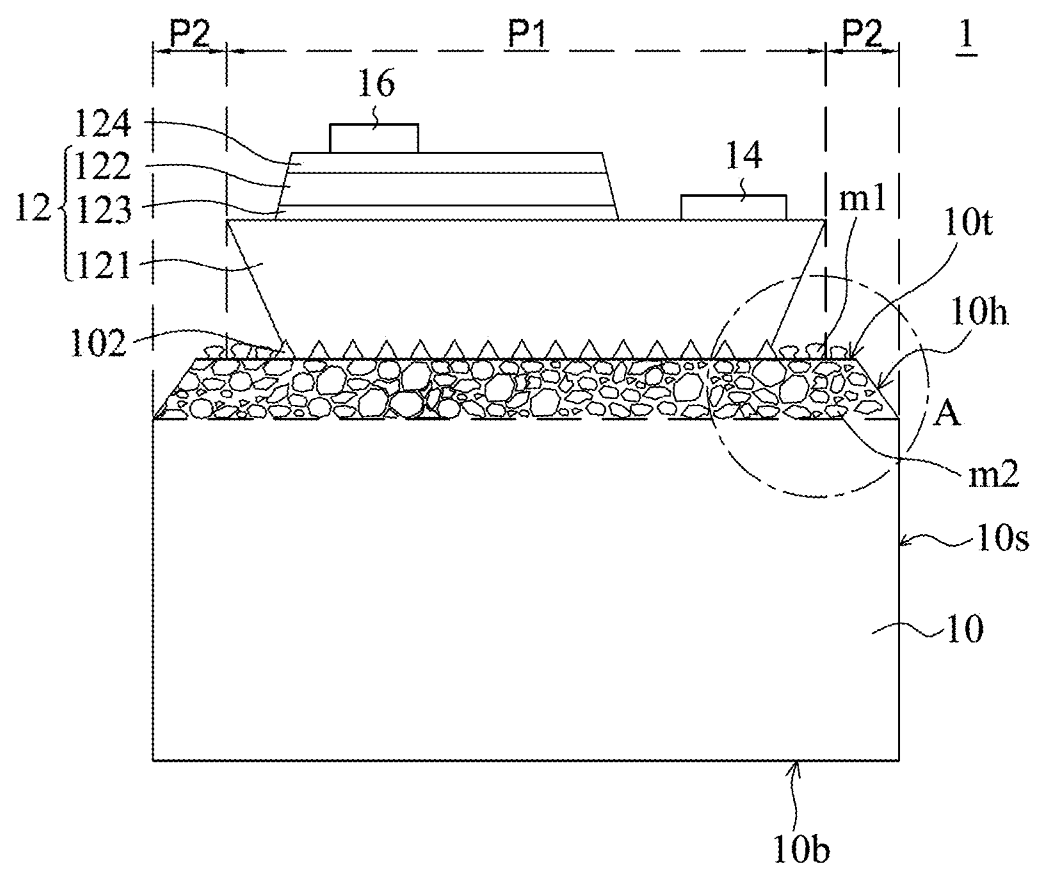
FIG. 1 shows a side view of a light-emitting device in accordance with a first embodiment of the present disclosure.
Figure 2:
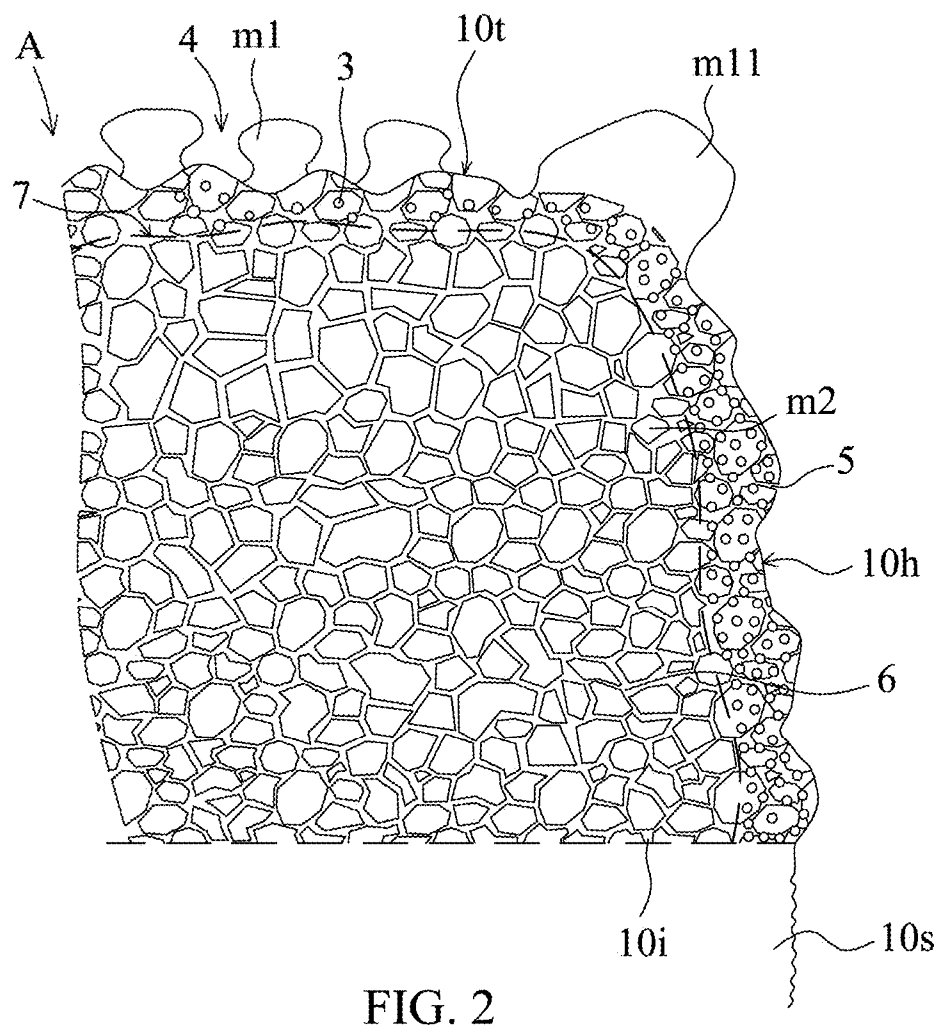
FIG. 2 shows a side view of a magnified view of region A of the light-emitting device of FIG. 1.

FIG. 1 shows a side view of a light-emitting device 1 in accordance with an embodiment of the present disclosure. FIG. 2 shows a side view of a magnified view of region A of the light-emitting device 1 of FIG. 1. The light-emitting device 1 comprises a light-emitting stack 12 epitaxially grown on a substrate 10 by epitaxy method, such as metallic-organic chemical vapor deposition (MOCVD) method, molecular beam epitaxy (MBE) method, or hydride vapor phase epitaxy (HVPE) method. The light-emitting stack 12 comprises a first semiconductor layer 121 having a first conductivity type, a second semiconductor layer 122 having a second conductivity type different from the first conductivity type, and an active layer 123 formed between the first semiconductor layer 121 and the second semiconductor layer 122. The active layer 123 comprises a single heterostructure (SH), a double heterostructure (DH), or a multi-quantum well (MQW) structure. In one embodiment, the first semiconductor layer 121 is an n-type semiconductor layer for providing electrons, the second semiconductor layer 122 is a p-type semiconductor layer for providing holes, and holes and electrons combine in the active layer 123 to emit light under a driving current. The material of the active layer 123 comprises $In_xGa_yAl_{1-x-y}N$ for emitting light having a dominant wavelength in the ultraviolet to green spectral regions, $In_xGa_yAl_{1-x-y}P$ for emitting light having a dominant wavelength in the yellow to red spectral regions, or $In_xGa_yAl_{1-x-y}As$ for emitting light having a dominant wavelength in the infrared spectral region. In one embodiment, the light-emitting stack 12 comprises an inverted pyramidal shape.

A transparent conductive layer 124 comprising conductive material is formed on the second semiconductor layer 122. The transparent conductive layer 124 covers a substantially entire surface of the second semiconductor layer 122, and is transparent to the wavelength of the light emitted from the active layer 123. The transparent conductive layer 124 can be formed of a thin metal film or a metal oxide film, such as zinc oxide, indium oxide, tin oxide, indium tin oxide (ITO), or indium zinc oxide (IZO).

A first electrode 14 and a second electrode 16 are respectively formed on the first semiconductor layer 121 and the second semiconductor layer 122. The first electrode 14 and the second electrode 16 comprise metal material having low electrical resistance, such as Au, Al, Pt, Cr, Ti, Ni, W, or the combination thereof, and can be formed of a monolayer film or a multilayer film. A thickness of the first electrode 14 or the second electrode 16 is about 0.1 to 10 microns. The first electrode 14 and the second electrode 16 can have any shape such as rectangular, polygon, circle, and ellipse from a top view of the light-emitting device 1.

The first electrode 14, the second electrode 16, and the transparent conductive layer 124 can be formed by sputtering, vapor deposition, or plating.

The substrate 10 comprises a single crystal material on which the light-emitting stack 12 can be epitaxial grown. An insulating material such as sapphire comprising C-plane, R-plane, or A-plane can be used to be the substrate 10. In another example, silicon carbide (SiC), silicon, ZnO, GaAs, GaN can be used. Further, the light-emitting device 1 can be flipped to mount to a sub-mount (not shown), and majority of the light is extracted from a bottom surface 10_b_ of the substrate 10. Therefore, since light emitted from the active layer 123 mainly emits through the bottom surface 10_b_ of the substrate 10, the substrate 10 is preferably transparent to the dominant wavelength of the light.

The substrate 10 comprises a top surface 10_t_ having a first portion p1 and a second portion p2 surrounding the first portion p1 viewing from a top of the light-emitting device 1, a side surface 10_s_ approximately perpendicular to the top surface 10_t_, and an inclined surface 10_h_ formed between the top surface 10_t_ and the side surface 10_s_, wherein an angle between the top surface 10_t_ and the inclined surface 10_h_ or an angle between the inclined surface 10_h_ and the side surface 10_s_ is larger than 90 degrees, or preferably between 90 and 130 degree, or more preferably between 95 and 110 degree.

The top surface 10_t_ is approximately parallel to a plane of the active layer 123, and the top surface 10_t_ comprises a plurality of concavo-convex structures regularly pattern distributed on the substrate 10. More specifically, the plurality of concavo-convex structures is periodically distributed on the substrate 10. In one example of the embodiment, the concavo-convex structures 102 within the first portion p1 of the top surface 10_t_ have an uniform shape, a cone shape for example, and the concavo-convex structures within the second portion p2 of the top surface 10_t_ have dissimilar shapes to each other. The plurality of concavo-convex structures and the substrate 10 are of one-piece and substantially composed of the same material.

FIG. 2 shows a magnified side view of region A of the light-emitting device 1 of FIG. 1. As shown in FIG. 2, the plurality of concavo-convex structures formed on the second portion p2 of the top surface 10_t_ comprises a plurality of first micro-structures m1. More specifically, the plurality of first micro-structures m1 comprises a plurality of first micro-protrusions protruded from the substrate 10. Feature sizes of the plurality of first micro-structures m1 are dissimilar. In an example of the embodiment, the plurality of first micro-structures m1 comprises a height ranging from 0.1 μm to 5 μm from a cross sectional view of the light-emitting device 1. The first micro-structures m11 closest to the inclined surface 10_h_ has a greater height than other first micro-structures m1 distant from the inclined surface 10_h_. In an example of the embodiment, a height of the first micro-structures m11 closest to the inclined surface 10_h_ is 1.5 to 2.5 times a height of others of the plurality of first micro-structures m1 distant from the inclined surface 10_h_. Parts of the plurality of first micro-structures m1 have a mushroom shape with the caps connected each other, thus a space 4 is defined between the plurality of first micro-structures m1. In an example of the embodiment, the space 4 comprises a width between 0.1 μm and 1 μm.

An upper part of the substrate 10 comprises a plurality of second micro-structures m2, and a lower part of the substrate 10 is free of such micro-structures like the first micro-structure m1 and the second micro-structure m2, wherein the upper part of the substrate 10 is defined by a region surrounded by the inclined surface 10_h_, and the lower part of the substrate 10 is defined by a region surrounded by the side surface 10_s_.

The substrate 10 comprises a plurality of second micro-structures m2 distributing from the top surface 10_t_ to an interior 10_i_ of the substrate 10. A distance between the top surface 10_t_ and the interior 10_i_ is not smaller than 10% of a thickness of the substrate 10 or not smaller than 8 microns. Preferrably, the distance between the top surface 10_t_ and the interior 10_i_ is larger than 10 μm when the thickness of the substrate 10 is larger than 80 μm. The plurality of second micro-structures m2 comprises irregular shape, thus a micro-space 6 is formed between adjacent two of the plurality of second micro-structures m2. The plurality of second micro-structures m2 comprises a feature size larger than that of the plurality of first micro-structures m1. The "feature size" means a maximum length between any two points of a structure. In an example of the embodiment, the plurality of second micro-structures m2 comprises a height ranging from 1 μm to 5 μm, and/or a width ranging from 3 μm to 10 μm from a cross sectional view of the light-emitting device 1

As shown in FIG. 2, the substrate 10 comprises a plurality of pores 3 formed on the plurality of second micro-structures m2. The plurality of pores 3 comprises a feature size smaller than a feature size of a space 4 defined by adjacent two first micro-structures m1 or smaller than a feature size of the a micro-space 6 defined by adjacent two second micro-structures m2. In an example of the embodiment that the substrate 10 is a sapphire substrate, the plurality of pores 3 is confined by sides with crystal planes such as R-plane of the sapphire substrate. Each of the plurality of pores 3 comprises a feature size ranging from 0.02 μm to 0.2 μm. The plurality of pores 3 comprises hexagonal shape. A side surface of the plurality of pores 3 comprises an inclined surface. The plurality of pores 3 comprises vacancy.

As show in FIG. 2, a roughness of the inclined surface 10*h* is larger than that of the side surface 10*s*. The inclined surface 10*h* comprises a plurality of recesses 5 which is connected with the micro-space 6 formed between the plurality of second micro-structures m2.

The substrate 10 comprises a doped region 7 formed within the second portion p2 of the substrate 10, wherein the plurality of pores 3 is formed in the doped region 7. In another words, the plurality of pores 3 is formed on the plurality of second micro-structures m2. In another embodiment, the doped region 7 is formed along an outer periphery of the first portion p1 of the substrate 10 viewing from a top of the light-emitting device 1. The doped region 7 is other than n-type and p-type. The doped region 7 comprises a dopant other than any dopants in the light-emitting stack. In an example of the embodiment, the dopant for forming the doped region 7 comprises argon cation, hydrogen cation, or nitrogen cation.

Figure 3:
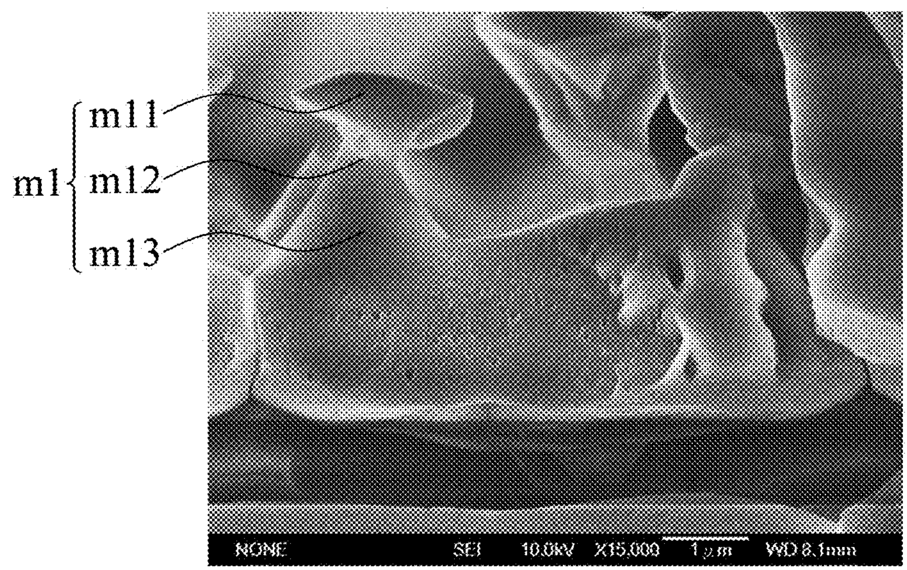
FIG. 3 shows a SEM diagram of a portion of a substrate surface of the light-emitting device in accordance with the first embodiment of the present disclosure.

FIG. 3 shows an SEM diagram of the light-emitting device 1 of FIG. 1. One of the plurality of first micro-structures m1 comprises an upper part m11, middle part 12, and a lower part m13, wherein the middle part m12 is formed between the upper part m11 and the lower part m13, and the middle part m12 comprises a width smaller than that of the upper part m11 and that of the bottom part m13. The lower part m13 comprises a pyramidal shape from a cross sectional view of the light-emitting device 1.

First Process Embodiment

Figure 4A:
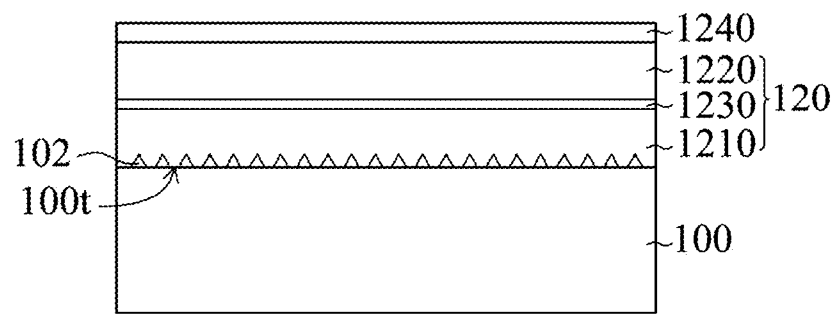
FIGS. 4A-4F show a process flow of a manufacturing method of the light-emitting device in accordance with a first process embodiment of the present disclosure.
Figure 4B:
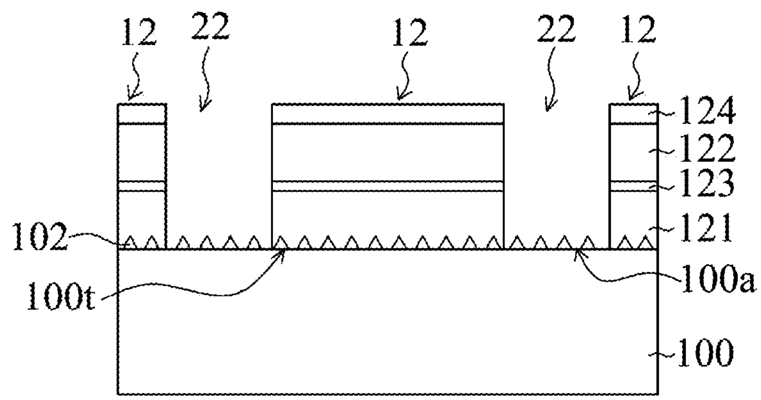
Figure 4C:
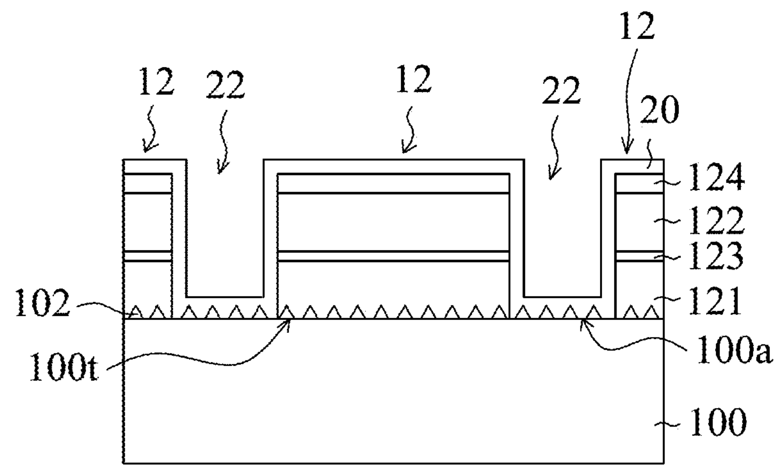
Figure 4D:
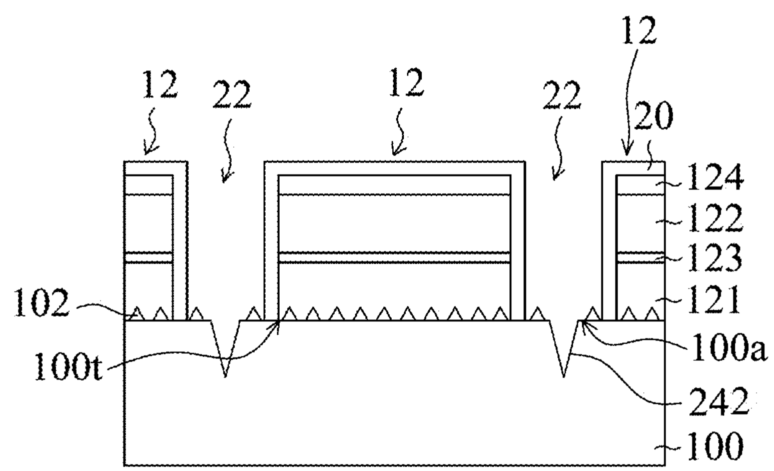
Figure 4E:
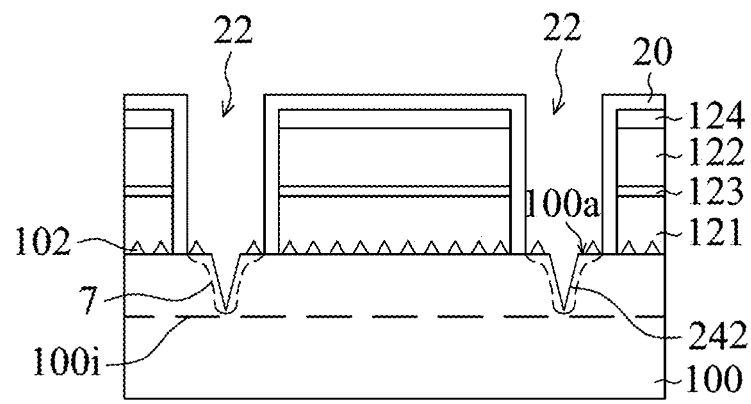
Figure 4F:
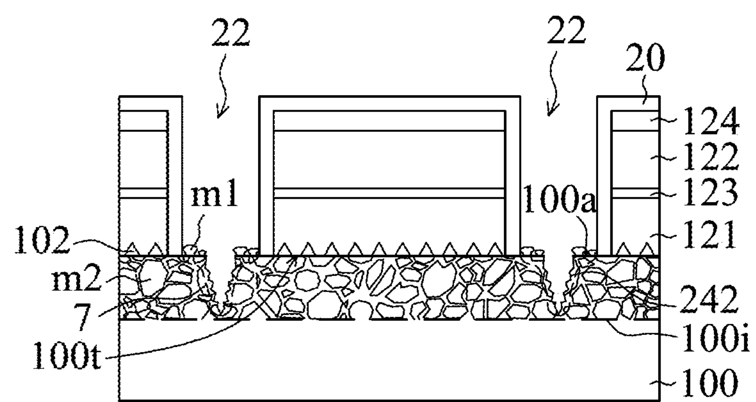
Figure 6:
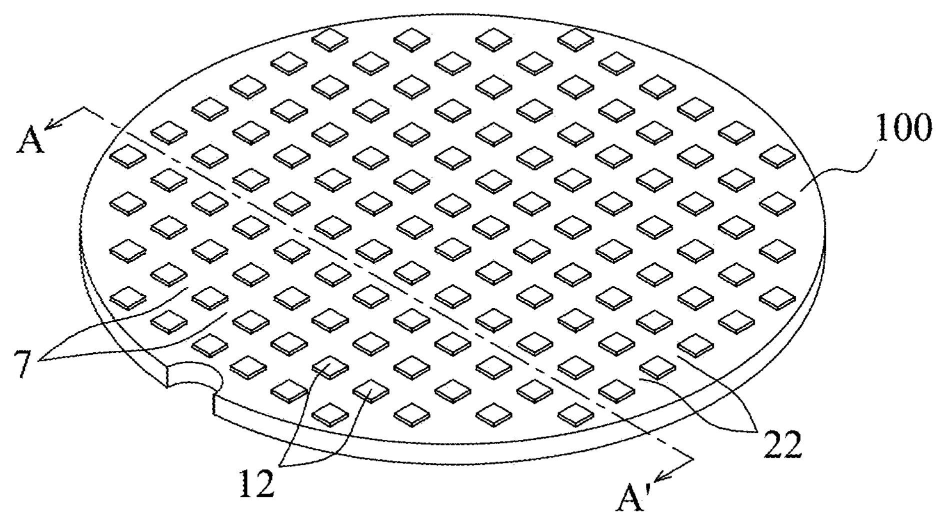
FIG. 6 shows a top view of FIG. 4E or FIG. 4F.

FIGS. 4A-4F show a manufacturing method of the light-emitting device 1 in accordance with an embodiment of the present disclosure. FIG. 6 shows a top view of FIG. 4E or FIG. 4F, and FIG. 4E or FIG. 4F shows cross-section views from line A-A' of FIG. 6. First, as shown in FIG. 4A, a semiconductor stack 120 is epitaxially grown on a growth wafer 100. The semiconductor stack 120 comprises a first semiconductor layer 1210 having a first conductivity type, a second semiconductor layer 1220 having a second conductivity type different from the first conductivity type, and an active layer 1230 formed between the first semiconductor layer 1210 and the second semiconductor layer 1220. The growth wafer 100 comprises a top surface 100*t* comprising a plurality of concavo-convex structures 102 which improves light extraction efficiency of the light-emitting device 1, wherein the plurality of concavo-convex structures 102 is regularly pattern distributed between the growth wafer 100 and the semiconductor stack 120, and the plurality of concavo-convex structures 102 is formed by patterning and etching the growth wafer 100 such that the growth wafer 100 and the plurality of concavo-convex structures 102 are of one-piece and substantially composed of the same material. The plurality of concavo-convex structures 102 is periodically arranged with a uniform shape. For example, each of the plurality of concavo-convex structures 102 comprises a cone shape. A transparent conductive layer 1240, for example, a layer comprising indium tin oxide (ITO) is formed on the semiconductor stack 120. More specifically, the transparent conductive layer 1240 is formed on the second semiconductor layer 1220.

Next, as shown in FIG. 4B, the semiconductor stack 120 is patterned to form a plurality of light-emitting stacks 12 separated by a plurality of trenches 22, wherein each of the plurality of light-emitting stacks 12 comprises a first semiconductor layer 121 having a first conductivity type, a second semiconductor layer 122 having a second conductivity type different from the first conductivity type, and an active layer 123 formed between the first semiconductor layer 121 and the second semiconductor layer 122.

Next, as shown in FIG. 4C, a protective layer 20 is conformably formed on the plurality of the light-emitting stacks 12 and an exposed portion 100*a* of the growth wafer 100, wherein the exposed portion 100*a* of the growth wafer 100 is defined by the trench 22. In an example of FIG. 4C, the protective layer 20 can be a silicon oxide layer having a thickness of approximately 500~5000 angstroms. The protective layer 20 can be formed by chemical vapor deposition, or spin-coating.

Next, as shown in FIG. 4D, an upper part of the growth wafer 100 is divided or removed by laser dicing or blade cutting along the plurality of trenches 22. In another words, laser dicing or blade cutting is processed in the exposed portion 100*a* of the growth wafer 100. Thus, a V-shape scribing region is formed on an upper part of the growth wafer 100 from a cross sectional view of the growth wafer 100, and formed inside the exposed portion 100*a* of the growth wafer 100 from a top view of the growth wafer 100, wherein the V-shape scribing region is free of the protective layer 20.

Next, as shown in FIG. 4E and FIG. 6, ions such as argon cation, hydrogen cation, or nitrogen cation can be implanted into a depth of the growth wafer 100 not covered by the protective layer 20 through an ion implanter. The depth is not smaller than 10% of a thickness of the growth wafer 100 or not smaller than 8 microns. Preferably, the distance between the top surface 100*t* and the interior 100*i* is larger than 10 μm when the thickness of the growth wafer 100 is larger than 80 μm. FIG. 4E shows a cross-section view from line A-A' of FIG. 6. The exposed portion 100*a* of the growth wafer 100 and an exposed surface 242 of the V-shape scribing region are doped by the ions, thus a doped region 7 is formed in FIG. 4E. In another example of the embodiment, the step of FIG. 4E can be processed prior to the step of FIG. 4D.

Figure 5:
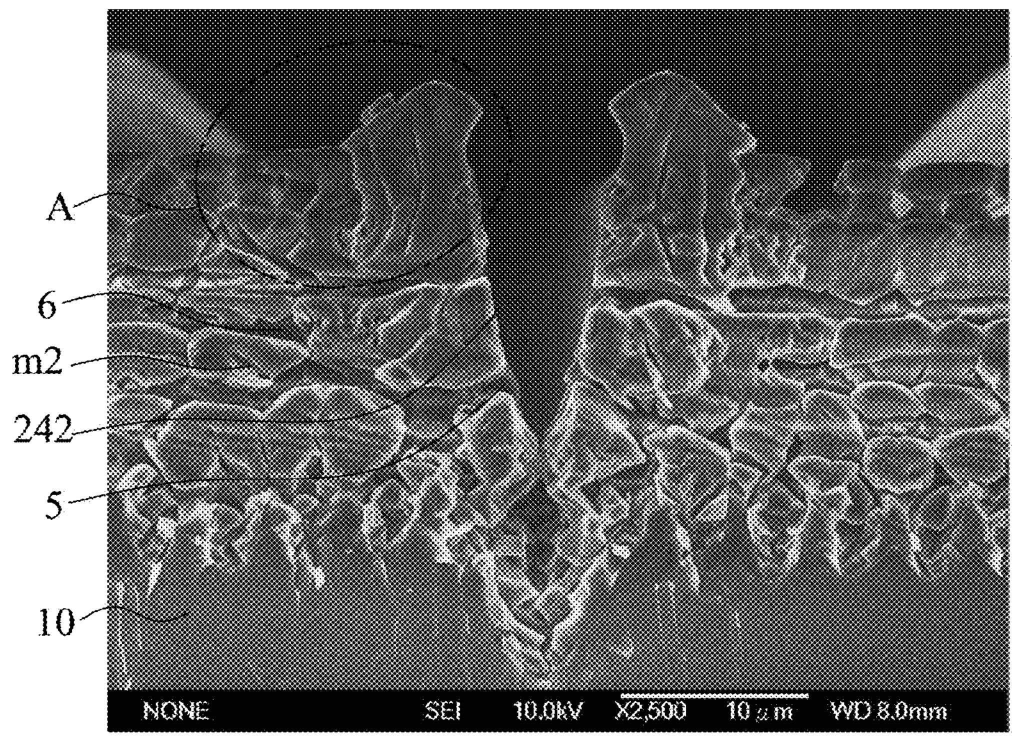
FIG. 5 shows a SEM diagram of a portion of FIG. 4F.

Next, as shown in FIG. 4F and FIG. 6, the doped region 7 is etched by an etchant such as HF. The etchant flows from the exposed portion 100*a* of the growth wafer 100 and an exposed surface 242 of the V-shape scribing region of the doped region 7, and into an interior of the growth wafer 100, thus the exposed surface 242 of the V-shape scribing region is roughened by the etching step, and the plurality of concavo-convex structures (not shown) of the exposed portion 100*a* of the growth wafer 100 is roughened to form the plurality of first micro-structures m1 of FIG. 2, and an upper part of the growth wafer 100 is roughened to form the plurality of second micro-structures m2 distributed from the top surface 100*t* to an interior 100*i* of the growth wafer 100. FIG. 5 shows a SEM diagram of FIG. 4F. The etchant flows from a plurality of recesses 5 formed on an exposed surface 242 of the V-shape scribing region, and into the exterior 100*i* of the growth wafer 100 along a plurality of micro-space 6 to form the plurality of second micro-structures m2.

As shown in FIG. 4F, a distance between the top surface 100*t* and the interior 100*i* is not smaller than 10% of a thickness of the growth wafer 100 or not smaller than 8 microns. Specifically, the V-shape scribing region comprises a depth larger than 10 μm, and the thickness of the growth wafer 100 is larger than 80 μm. The plurality of regular concavo-convex structures 102 formed on the exposed portion 100*a* of the growth wafer 100 is etched by the etchant to form the plurality of first micro-structures m1 of FIG. 2, and the detailed description is described above with reference to FIGS. 1-3.

Moreover, a lower part of the growth wafer 100 is divided or removed by laser dicing or physical breaking. In an example of the embodiment, the upper part of the growth wafer 100 is divided by laser dicing, and the lower part of the growth wafer 100 is divided by physically breaking. In another example of the embodiment, the upper part of the growth wafer 100 is divided by physically breaking, and the lower part of the growth wafer 100 is divided by laser dicing. In another example of the embodiment, both the upper part and the lower part of the growth wafer is both divided by laser dicing or physically breaking. The dividing position of the lower part of the growth wafer 100 is divided by laser dicing or physical breaking through a position corresponding to the V-shape scribing region, thus the growth wafer 100 and the light-emitting stacks thereon are separated into a plurality of chips. Each of the plurality of chips comprises the substrate 10 and the light-emitting stack 12 formed on the substrate 10 as previously described in the foregoing embodiments and FIG. 1-3.

According to an embodiment of the present disclosure, total internal reflection of the light emitted from the active layer of the light-emitting device is reduced by forming the plurality of first micro-structures and the plurality of second micro-structures, thus light extraction efficiency is improved. In addition, the light extraction efficiency can be further improved by the inclined surface of the substrate of the light-emitting device, because the total internal reflection is also reduced by the inclined surface.

Second Embodiment

Figure 7A:
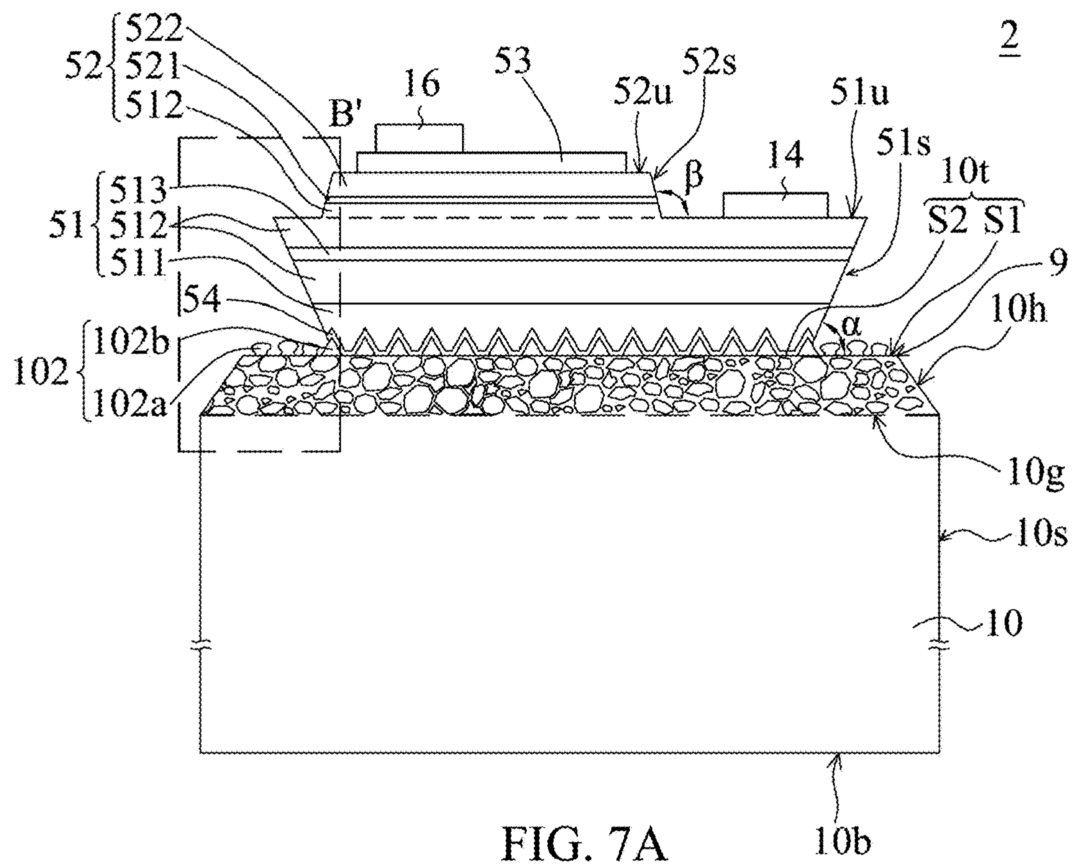
FIGS. 7A~7C show a cross-sectional view of a light-emitting device in accordance with a second embodiment of the present disclosure.
Figure 7B:
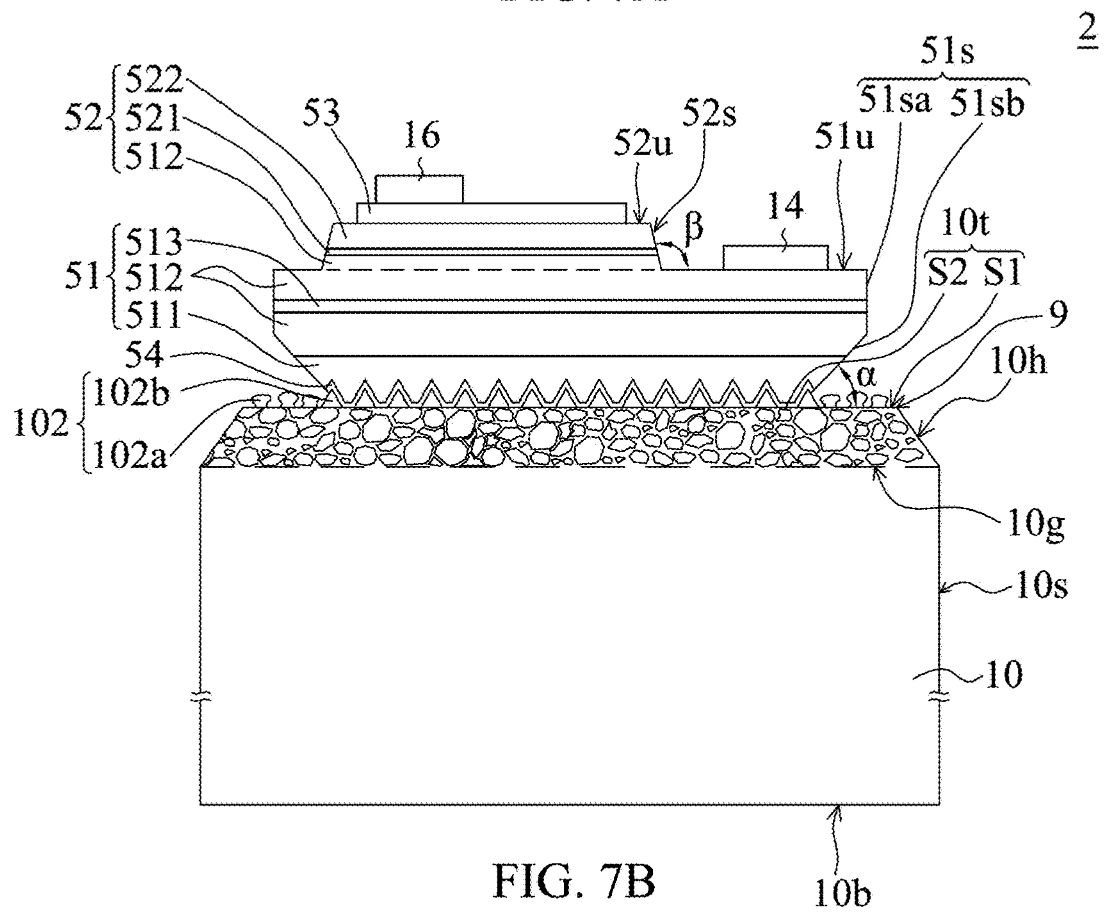
Figure 7C:
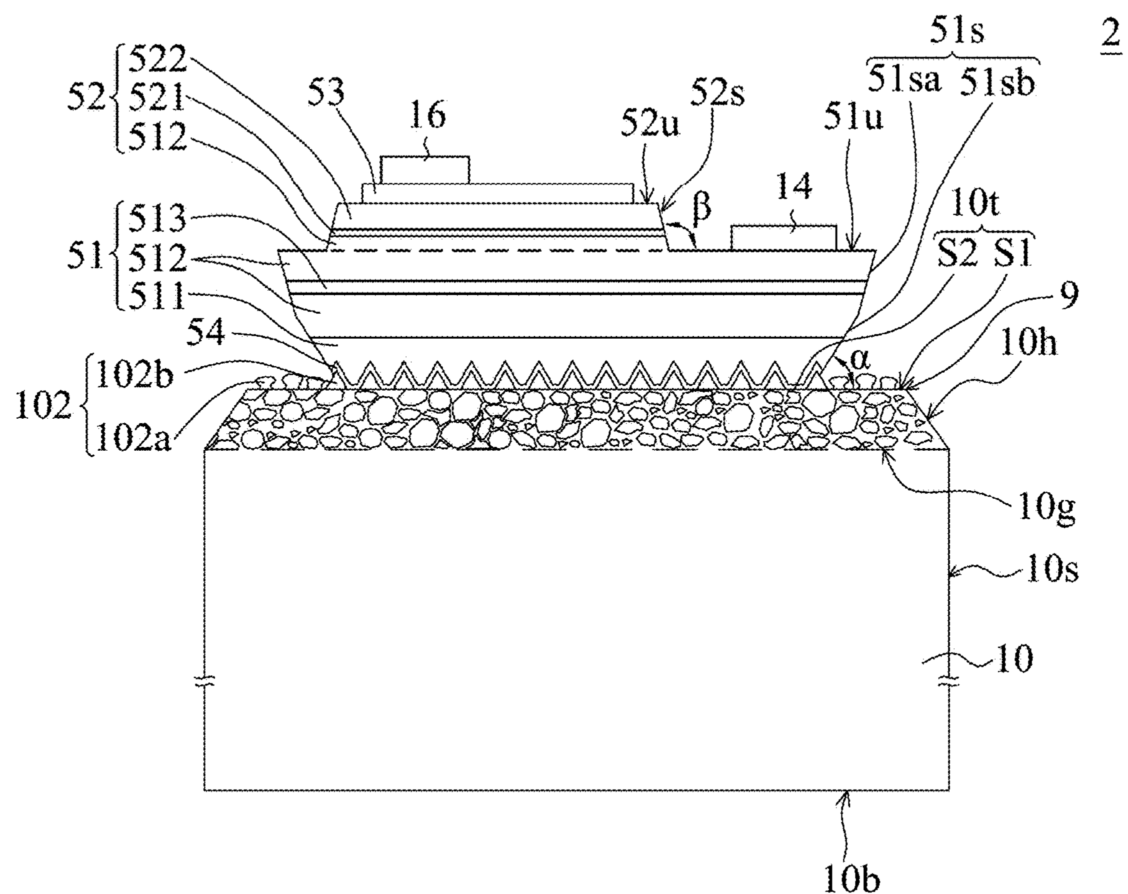
Figure 8:
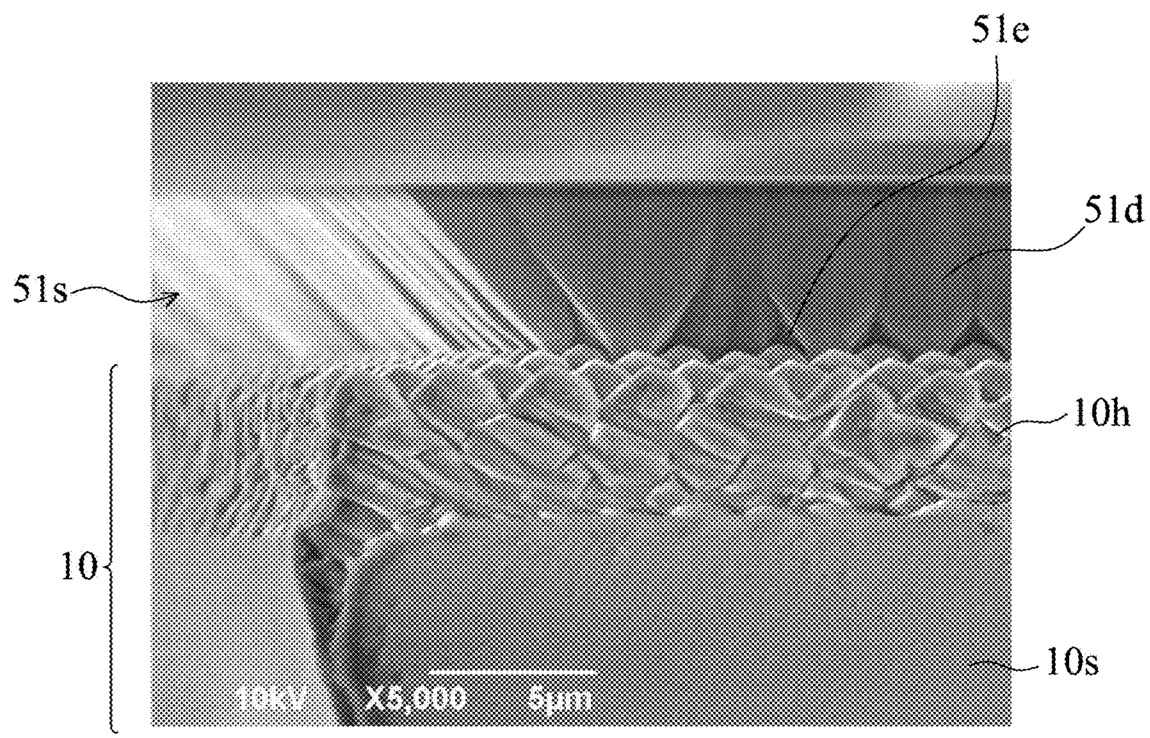
FIG. 8 shows a SEM diagram of an area B of the second embodiment shown in FIG. 7A.
Figure 9:
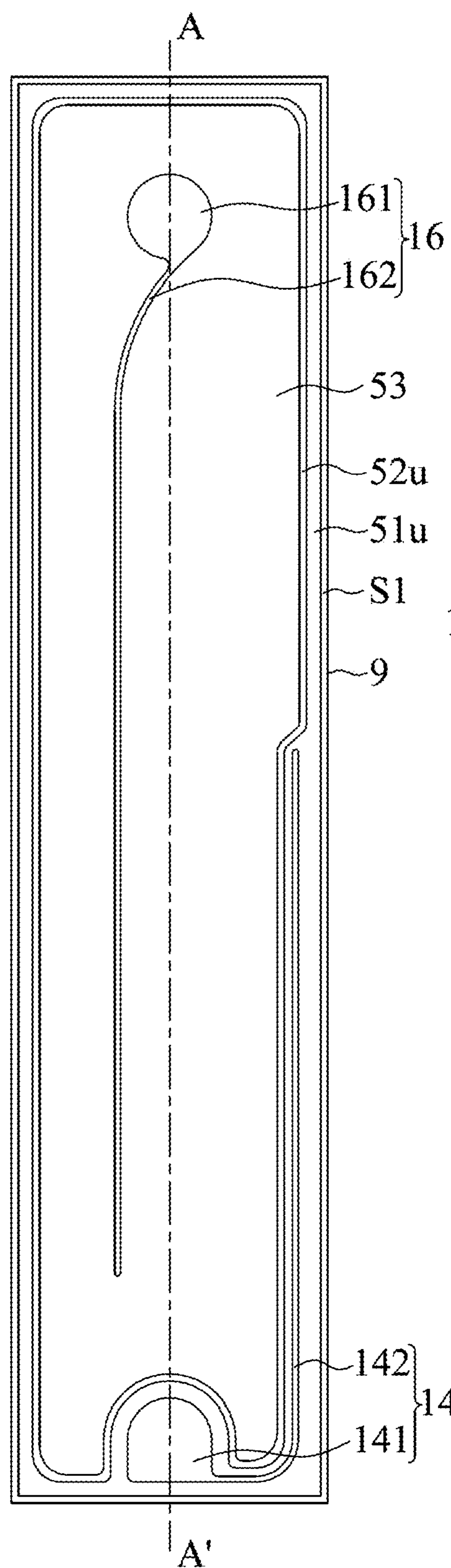
FIG. 9 shows a top-view of the second embodiment shown in FIG. 7A.

FIGS. 7~9 show a light-emitting device 2 in accordance with a second embodiment of the present disclosure, wherein FIG. 9 shows a top-view of the light-emitting device 2, and FIGS. 7A~7C show a cross-sectional view of the light-emitting device 2 along a dotted line AA' of FIG. 9. The light-emitting device 2 is capable of emitting a light and comprises a substrate 10 having a top surface 10*t*, a first semiconductor stack 51 on the top surface 10*t* and exposing a first portion S1 of the top surface 10*t*, wherein the first semiconductor stack 51 has a first upper surface 51*u* and a first side wall 51*s* connecting the top surface 10*t*, a second semiconductor stack 52 on the first upper surface 51*u* and exposing an exposing portion of the first upper surface 51*u*, wherein the second semiconductor stack 52 has a second upper surface 52*u* and a second side wall 52*s* connecting the first upper surface 51*u*, a transparent conductive layer 53 is on the second upper surface 52*u*, a first electrode 14 is on the exposing portion of the first upper surface 51*u*, and a second electrode 16 is on the transparent conductive layer 53. The top surface 10*t* of substrate 10 further comprises an edge 9 and a second portion S2 covered by the first semiconductor stack 51, wherein, from the top-view of the light-emitting device 2 shown in FIG. 9, the first portion S1 is between the edge 9 and the second portion S2. Further, the light-emitting device 2 may comprise a buffer layer 54 between the first semiconductor stack 51 and the second portion S2 of the top surface 10*t* for improving the quality of the first semiconductor stack 51 and the second semiconductor stack 52. As shown in FIG. 9, from the top-view of the light-emitting device 2, on the top surface 10*t* of the substrate 10, the first portion S1 surrounds the second portion S2. Preferably, in an embodiment, the shortest distance between the second portion S2 and the edge 9 is between about 1 μm and 25 μm for increasing light output. Preferably, in another embodiment, a ration of an area of the first portion S1 to an area of the top surface 10*t* is between about 0.02 and 0.35 for preventing the areas of the first semiconductor stack 51 and the second semiconductor stack 52 from the top-view to be too small and increasing light output.

In the present disclosure, the substrate 10 may comprise electrically insulating material, such as sapphire, or electrically conductive material, such as silicon carbide (SiC), silicon, ZnO, GaAs, and GaN. In the second embodiment, for example, the substrate 10 is formed of single crystal material for growing semiconductor layers thereon, including the first semiconductor stack 51 and the second semiconductor stack 52. As shown in FIG. 7A, the substrate 10 further comprises a bottom surface 10*b* opposite to the top surface 10*t*, a side surface 10*s* connecting the bottom surface 10*b* and approximately perpendicular to the bottom surface 10*b* or the top surface 10*t*, and an inclined surface 10*h* connecting the top surface 10*t* and the side surface 10*s*, wherein an angle between the top surface 10*t* and the inclined surface 10*h* and an angle between the inclined surface 10*h* and the side surface 10*s* are both larger than 90 degrees. Preferably, in an embodiment, the inclined surface 10*h* is formed by laser cutting, and a root-mean-square roughness of the inclined surface 10*h* is between about 0.1 μm and 1 μm and the inclined surface 10*h* is rougher than the side surface 10*s* for increasing the quantity of the light exported from the substrate 10. Preferably, in another embodiment, on the inclined surface 10*h*, the shortest distance between the top surface 10*t* and a border 10*g* of the inclined surface 10*h* and the side surface 10*s* is between about 0.1 μm and 20 μm.

In the second embodiment, the substrate 10 comprises multiple concavo-convex structures 102 which are distributed on the top surface 10*t*. In an embodiment, the concavo-convex structures 102 comprises multiple first concavo-convex structures 102*a* within the first portion S1 of the top surface 10*t* and multiple second concavo-convex structures 102*b* within the second portion S2 of the top surface 10*t*, wherein the multiple second concavo-convex structures 102*b* are periodically distributed on the substrate 10 and have uniform shapes, such as cone shapes, and the shapes of the multiple first concavo-convex structures 102*a* are different from each other. Preferably, in an embodiment, the heights of the multiple concavo-convex structures 102 are between about 1 μm and 2.5 μm and the diameters of the multiple concavo-convex structures 102 are between about 2 μm and 4 μm. In addition, the sizes of the multiple first concavo-convex structures 102*a*, such as height or diameter, are smaller than the sizes of the multiple second concavo-convex structures 102*b*. The multiple concavo-convex structures 102 and the substrate 10 are unity and substantially made of the same material. In the second embodiment, the second semiconductor stack 52 is able to emit a light, and the material of the substrate 10 is transparent for the light emitted from the second semiconductor stack 52. The multiple concavo-convex structures 102 are able to increase the light extraction efficiency of the light-emitting device 2.

The buffer layer 54 conformally covers the second portion S2 of the top surface 10*t* for decreasing the dislocation densities of the first semiconductor stack 51 and the second semiconductor stack 52 and improving the quality of the first semiconductor stack 51 and the second semiconductor stack 52. The material of the buffer layer 54 comprises GaN or AlN, and in an embodiment the thickness of the buffer layer 54 is preferably between about 5 nm and 50 nm for decreasing the quantity of the light being absorbed by the buffer layer 54 and decreasing the dislocation densities of the first semiconductor stack 51 and the second semiconductor stack 52 being lower than $1*10^{12}$ pits/cm2.

The first semiconductor stack 51 is on the buffer layer 54, and the second semiconductor stack 52 is on the first semiconductor stack 51. The first semiconductor stack 51 comprises an undoped layer 511 and a part of a first doped layer 512 on the undoped layer 511, and the second semiconductor stack 52 comprises the other part of the first doped layer 512, an active layer 521 on the first doped layer 512, and a second doped layer 522 on the active layer 521. The first doped layer 512 and the second doped layer 522 have different polarity. For example, the first doped layer 512 can be an n-type semiconductor layer for providing electrons, the second doped layer 522 can be a p-type semiconductor layer for providing holes, and holes and electrons combine in the active layer 521 to emit light under a driving current. The material of the undoped layer 511, the first doped layer 512, the active layer 521 and the second doped layer 522 includes one or more elements selected form Ga, Al, In, P, N, Zn, Cd or Se. For example, the material includes nitride based material. In addition, the material of the undoped layer 511 and the first doped layer 512 includes $Al_{x1}Ga_{y1}In_{(1-x1-y1)}N$, wherein $0\leq(x1,y1)\leq1$, x1+y1, and Si or Te can be doped into the first doped layer 512 to form an n-type semiconductor layer. In an embodiment the concentration of Si or Te in the first doped layer 512 is preferably between about $5*10^{16}$ $cm^{-3}$ and $1*10^{19}$ $cm^{-3}$ for providing enough electrons to the active layer 521. In addition, the material of the second doped layer 522 includes $Al_{x2}Ga_{y2}In_{(1-x2-y2)}N$, wherein $0\leq x2$, $y2\leq1$, $x2+y2\leq1$, and Zn, C or Mg can be doped into the second doped layer 522 to form a p-type semiconductor layer. In an embodiment the concentration of Zn, C or Mg in the second doped layer 522 is preferably between about $5*10^{17}$ $cm^{-3}$ and $1*10^{19}$ $cm^{-3}$ for providing enough electrical holes to the active layer 521 to combine with the electrons and emit the light. In another embodiment, the total thickness of the undoped layer 511 and the first doped layer 512 are preferably between about 0.1 μm and 10 μm, and more preferably between about 1 μm and 5 μm for preventing absorb the light emitted from the active layer 521. The thickness of the undoped layer 511 can be larger, equal to or smaller than the thickness of the first doped layer 512. In the second embodiment, for example, the thickness of the undoped layer 511 is between about 2 μm and 4 μm and the thickness of the first doped layer 512 is between about 3 μm and 5 μm, and the first semiconductor stack 51 has a thickness between about 5 μm and 9 μm. In an embodiment, the total thickness of the first doped layer 512 can be decreased to be between about 1 μm and 3 μm and the concentration of Si or Te in the first doped layer 512 can be limited at a range between about $5*10^{17}$ $cm^{-3}$ and $6*10^{18}$ $cm^{-3}$ for increasing the transparency of the first doped layer 512. Thus, based on the foregoing example of the second embodiment, as the thickness of the first doped layer 512 is between 1 μm and 3 μm and the undoped layer 511 is still between about 2 μm and 4 μm, the thickness of the first doped layer 512 is lower than the thickness of the undoped layer 511 for decreasing the quantity of the light emitted from the active layer 521 absorbed by the first doped layer 512 and increasing the light extraction efficiency of the light-emitting device 2. In another embodiment, the thickness of the second doped layer 522 is between about 0.1 μm and 4 μm, more preferably between about 1 μm and 3 μm and the thickness of the first doped layer 512 of the second semiconductor stack 52 is between about 0.9 μm and 3 μm, so the second semiconductor stack 52 has a thickness preferably between about 1 μm and 7 μm.

In an embodiment, the first doped layer 512 further comprises a dislocation stop layer 513 for decreasing the number of dislocations in the first doped layer 512, the active layer 521 and the second doped layer 522. The dislocation stop layer 513 can be formed in the first semiconductor stack 51 or the second semiconductor stack 52, and connecting the undoped layer 511 or the active layer 521. Preferably, the thickness of the dislocation stop layer 513 is between about 10 Å and 100 Å for preventing the lattice strain forming between the dislocation stop layer 513 and the first doped layer 512. The material of the dislocation stop layer 513 comprises $Al_{x1}Ga_{1-x1}N$, wherein $0<x1<1$, preferably $0.05<x1<0.1$, to form a difference of lattice constant between the dislocation stop layer 513 and the first doped layer 512 for decreasing the number of dislocations in the first doped layer 512. Wherein, Al concentration in the dislocation stop layer 513 is higher than 10 times of Al concentration in the first doped layer 512.

The material of the active layer 521 includes $Al_{x3}Ga_{y3}In_{(1-x3-y3)}N$, wherein $0\leq(x3,y3)\leq1$, $x3+y3\leq1$. The light emitted from the active layer 521 can be visible such as green or blue light or invisible such as UVA, UVB or UVC. For example, the active layer 521 is able to emit green or blue light with peak wavelength between 450 nm and 510 nm as the active layer 521 includes InGaN based material, and the active layer 521 can emit UV light with peak wavelength between 250 nm and 400 nm as the active layer 222 includes AlGaN based material. The structure of the active layer 521 can be single heterostructure (SH), double heterostructure (DH), double-side double heterostructure (DDH), multi-quantum well (MQW) or quantum dot. In the second embodiment, the structure of the active layer 521 is multi-quantum well (MQW) which comprises multiple well layers and multiple barrier layers overlapped to each other. In an embodiment, the thickness of each well layer and each barrier layer is between about 5 nm and 100 nm.

As shown in FIGS. 7A to 7C, the first side wall 51*s* and the first portion S1 of the top surface 10*t* form an acute angle α between thereof, wherein $30°\leq\alpha\leq80°$. Therefore, from the top-view of the light-emitting device 2 as shown in FIG. 9, a part of the first portion S1 is covered by the first semiconductor stack 51. The inclined first side wall 51*s* is not perpendicular to the top surface 10*t* to reduce total internal reflection for the light from the active layer 521 and increase light extraction efficiency of the light-emitting device 2. FIG. 8 shows a SEM diagram of an area B of the light-emitting device 2 shown in FIG. 7A. As shown in FIG. 8, the first side wall 51*s* is rough and comprises multiple pillars 51*d*, and voids 51*e* are formed between the top surface 10*t* and the first semiconductor stack 51. In an embodiment, the width of the pillar 51*d* is preferably between about 1 μm and 10 μm. The second semiconductor stack 52 is on the first upper surface 51*u* of the first semiconductor stack 51 and exposes an exposing portion of the first upper surface 51*u*, wherein the second side wall 52*s* and the exposing portion of the first upper surface 51*u* form an obtuse angle β between thereof, wherein $100°\leq\beta\leq170°$. Since the second side wall 52*s* is not perpendicular to the first upper surface 51*u*, total internal reflection for the light from the active layer 521 can be reduced and light extraction efficiency of the light-emitting device 2 can be increased. As shown in FIG. 7A, the first semiconductor stack 51 is an inverted trapezoidal and the second semiconductor stack 52 is a trapezoidal. As shown in FIGS. 7B and 7C, in another embodiment, the first side wall 51*s* comprises an upper first side wall 51*sa* and a lower first side wall 51*sb* connecting the upper first side wall 51*sa* and the top surface 10*t*, wherein the lower first side wall 51*sb* and the first portion S1 of the top surface 10*t* have an acute angle α between thereof. An angle between the upper first side wall 51_sa_ and S1 of the top surface 10_t_ is larger than the acute angle α between the lower first side wall 51_sb_ and the first portion S1, and smaller than or equal to 90° as shown in FIGS. 7B and 7C respectively. As shown in FIG. 7B, the upper first side wall 51_sa_ is approximately parallel to the side surface 10_s_.

The transparent conductive layer 53 is on the second upper surface 52_u_ and ohmically contacts the second doped layer 522 for laterally spreading an electrical current into the second doped layer 522. And, the transparent conductive layer 53 is transparent for the light emitted from the active layer 521. In an embodiment, a current blocking layer (not shown) may be disposed between a portion of the transparent conductive layer 53 and the second doped layer 522 for improving the electrical current laterally spreading. The material of the transparent conductive layer 53 comprises a metal oxide material, such as indium tin oxide (ITO), cadmium tin oxide (CTO), antimony tin oxide (ATO), indium zinc oxide (IZO), aluminum-doped zinc oxide (AZO), and zinc tin oxide (ZTO). The material of the current blocking layer comprises an insulating transparent material, such as $SiO_x$ and $SiN_X$. For preventing from decreasing the light extraction efficiency and reducing the ability of laterally spreading the electrical current, the thickness of the transparent conductive layer 53 is preferably between about 10 nm and 1000 nm and the thickness of the current blocking layer is preferably between about 10 nm and 1000 nm.

The first electrode 14 is on the first portion S1 of the first upper surface 51_u_ and ohmically contacts the first doped layer 512 of the first semiconductor stack 51. And, the second electrode 16 is formed on and ohmically contacts the transparent conductive layer 53. As shown in FIG. 9, the first electrode 14 comprises a first bonding pad 141 and a first finger 142 connecting the first bonding pad 141. In an embodiment, one or multiple current blocking structures may be formed between the first finger 142 and the first doped layer 512 for enhancing the electrical current spreading. The second electrode 16 comprises a second bonding pad 161 and a second finger 162 connecting the second bonding pad 161. The material of the first electrode 14 and the second electrode 16 comprises at least one element selected from Au, Ag, Cu, Cr, Al, Pt, Ni, Ti, Sn, or combinations thereof.

Second Process Embodiment

Figure 10A:
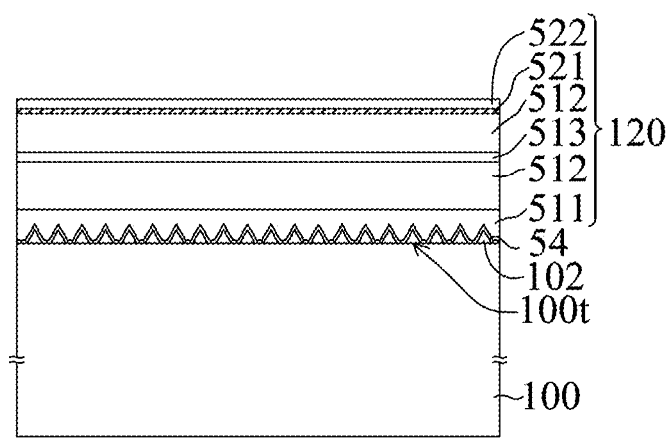
FIGS. 10A~10E show a manufacturing process of the light-emitting device in accordance with a second process embodiment of the present disclosure.
Figure 10B:
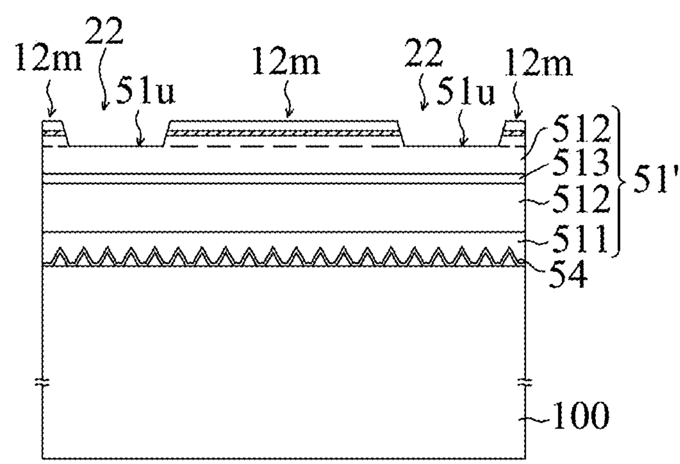
Figure 10C:
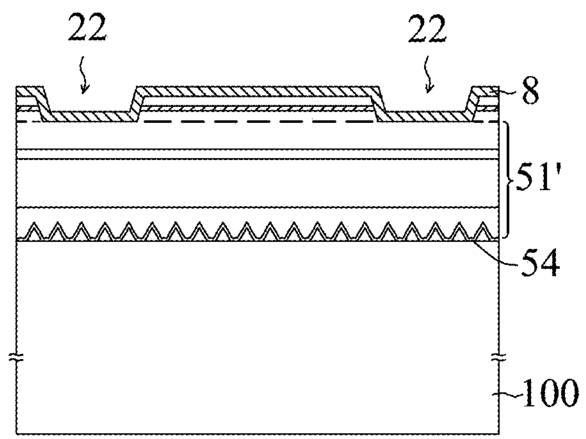
Figure 10D:
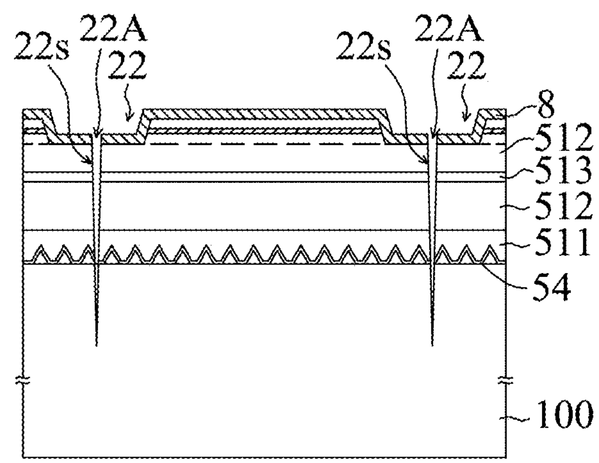
Figure 10E:
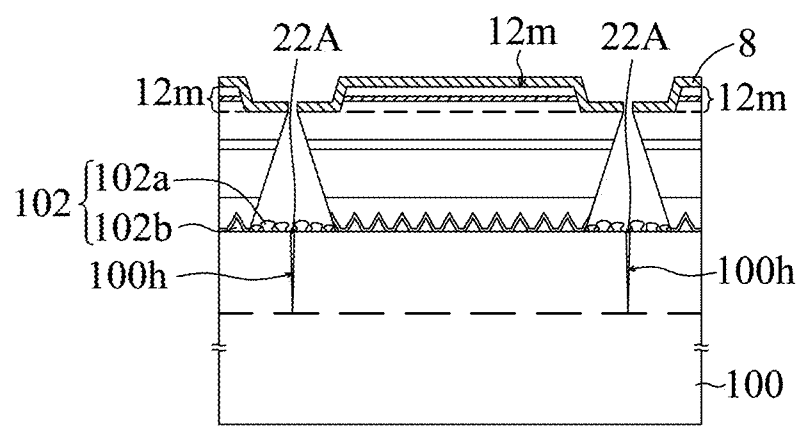

FIGS. 10A-10E show a manufacturing process of the light-emitting device 2 in accordance with a second process embodiment of the present disclosure, wherein FIGS. 10D and 10E shows a cross-section view along line A-A' of FIG. 6.

First, as shown in FIG. 10A, a buffer layer 54 is formed on a growth wafer 100 by Physical vapor deposition (PVD) or Chemical vapor deposition (CVD). Next, a semiconductor stack 120 is epitaxially grown on the buffer layer 54. The semiconductor stack 120 comprises an undoped layer 511 and a first doped layer 512 on the undoped layer 511, an active layer 521 on the first doped layer 512, and a second doped layer 522 on the active layer 521. In one embedment, during the process of epitaxially growing the first doped layer 512, a dislocation stop layer 513 may be formed in the first doped layer 512 for decreasing the number of dislocations in the first doped layer 512, the active layer 521 and the second doped layer 522. All the properties and functions of the buffer layer 54, the undoped layer 511, first doped layer 512, the active layer 521, the second doped layer 522 and the dislocation stop layer 513 are the same as those described in the second embodiment. The growth wafer 100 comprises multiple concavo-convex structures 102 on a top surface 100_t_ of the growth wafer 100 for improving light extraction efficiency of the light-emitting device 2, wherein the multiple concavo-convex structures 102 are distributed between the growth wafer 100 and the semiconductor stack 120. The multiple concavo-convex structures 102 may be formed by patterning and etching the growth wafer 100 such that the growth wafer 100 and the multiple concavo-convex structures 102 are integrated as whole and substantially composed of the same material. The multiple concavo-convex structures 102 are periodically arranged with a uniform shape. For example, the each concavo-convex structure 102 comprises a cone shape.

Next, as shown in FIG. 10B, the semiconductor stack 120 is patterned by dry etching method, such as ICP, to form multiple light-emitting sections 12_m_ separated by a plurality of trenches 22 on a semiconductor stack 51', wherein the plurality of trenches 22 exposes a first upper surface 51_u_ of the first doped layer 512. Any two of the neighboring light-emitting sections 12_m_ have a distance between about 10 μm and 50 μm. The depth of the trench 22 is larger than the total thickness of the active layer 521 and the second doped layer 522. Since the semiconductor stack 120 is patterned by dry etching method, the each second semiconductor stack 52 has a second side wall 52_s_, and the second side wall 52_s_ and the first upper surface 51_u_ form an obtuse angle β between thereof, wherein $100° \leq \beta \leq 170°$.

Next, as shown in FIG. 10C, a protective layer 8 is conformably formed on the multiple light-emitting sections 12_m_ and the first upper surface 51_u_ of the first doped layer 512. In an embodiment, the protective layer 8 can be a silicon oxide layer having a thickness of approximately 500~5000 angstroms. The protective layer 8 can be formed by chemical vapor deposition or spin-coating.

Next, as shown in FIG. 10D, a V-shape scribing region 22A is formed in the each trench 22 by laser dicing to divide the semiconductor stack 51' into multiple first semiconductor stacks 51 and expose the buffer layer 54 and an upper part of the growth wafer 100 from the protective layer 8, wherein each of the first semiconductor stacks 51 has the light-emitting section 12_m_ on thereof. From a cross sectional view of the growth wafer 100, each of the V-shape scribing regions 22A has a side wall 22_s_ to expose the first semiconductor stack 51, the buffer layer 54 and an inclined surface 100_h_ of the growth wafer 100. The depth D of the V-shape scribing regions 22A in the growth wafer 100 is between about 0.1 μm and 20 μm.

Next, as shown in FIG. 10E, an wet etch step is provided, and then each of the first semiconductor stacks 51 has a first side wall 51_s_, which is not perpendicular to the top surface 100_t_ of the growth wafer 100, and a portion of the top surface 100_t_ is exposed from the buffer layer 54 and the first semiconductor stack 51. The first side wall 51_s_ and the top surface 100_t_ exposed from the buffer layer 54 form an acute angle α between thereof, wherein $30° \leq \alpha \leq 80°$. And, for the growth wafer 100, the concavo-convex structures 102_a_ of the growth wafer 100 exposed from the buffer layer 54 have smaller sizes, such as height and/or diameter, than the sizes of the concavo-convex structures 102_b_ under the buffer layer 54. The inclined surface 100_h_ of the growth wafer 100 is etched to have a root-mean-square roughness between about 0.1 μm and 1 μm for increasing the quantity of the light exported from the substrate 10.

Then, the protective layer 8 is removed to expose multiple first upper surfaces 51_u_ of the first semiconductor stacks 51 and multiple second upper surfaces 52_u_ of the light-emitting sections 12*m*. The transparent conductive layer 53 is formed on the second upper surface 52*u*. The first electrode 14 is formed on the exposing portion of the first upper surface 51*u*, and the second electrode 16 is formed on the transparent conductive layer 53. And, a lower part of the growth wafer 100 is divided or removed by laser dicing, physical breaking, or combination thereof. The dividing position of the lower part of the growth wafer 100 is corresponding to the V-shape scribing regions 22A, and the growth wafer 100, the first semiconductor stacks 51 and the light-emitting sections 12*m* on the growth wafer 100 are separated into multiple chips accordingly. Each of the chips comprises the substrate 10, the first semiconductor stack 51, the second semiconductor stack 52, the transparent conductive layer 53, the first electrode 14, and the second electrode 16 as previously described in the foregoing embodiments of the present disclosure. All the material, properties and functions of the chips are the same as the light-emitting device 2 described in the present disclosure. Therefore, the total internal reflection of the light emitted from the active layer 521 of the light-emitting device 2 is reduced by the inclined first side wall 51*s* and the rough inclined surface 10*h*, and the light extraction efficiency is improved.

Third Embodiment

Figure 14A:
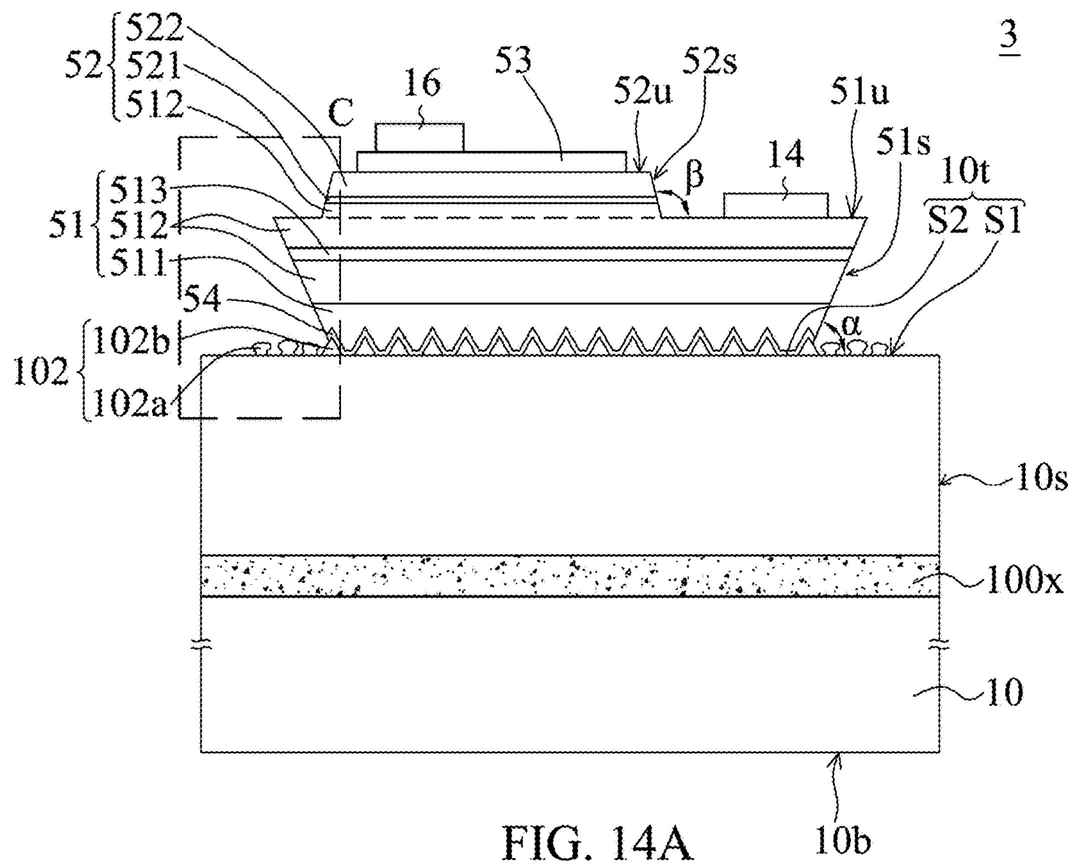
FIGS. 14A~14C show a cross-sectional view of a light-emitting device in accordance with a third embodiment of the present disclosure.
Figure 14B:
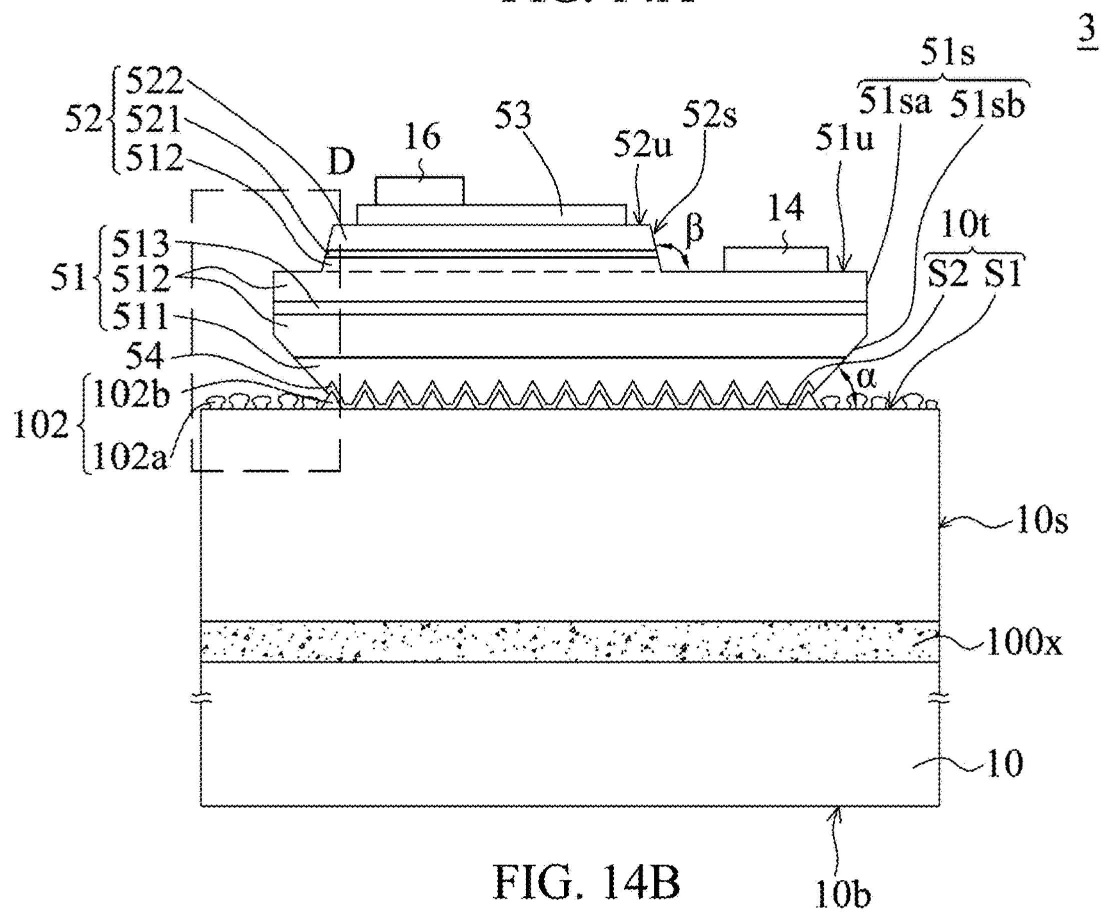
Figure 14C:
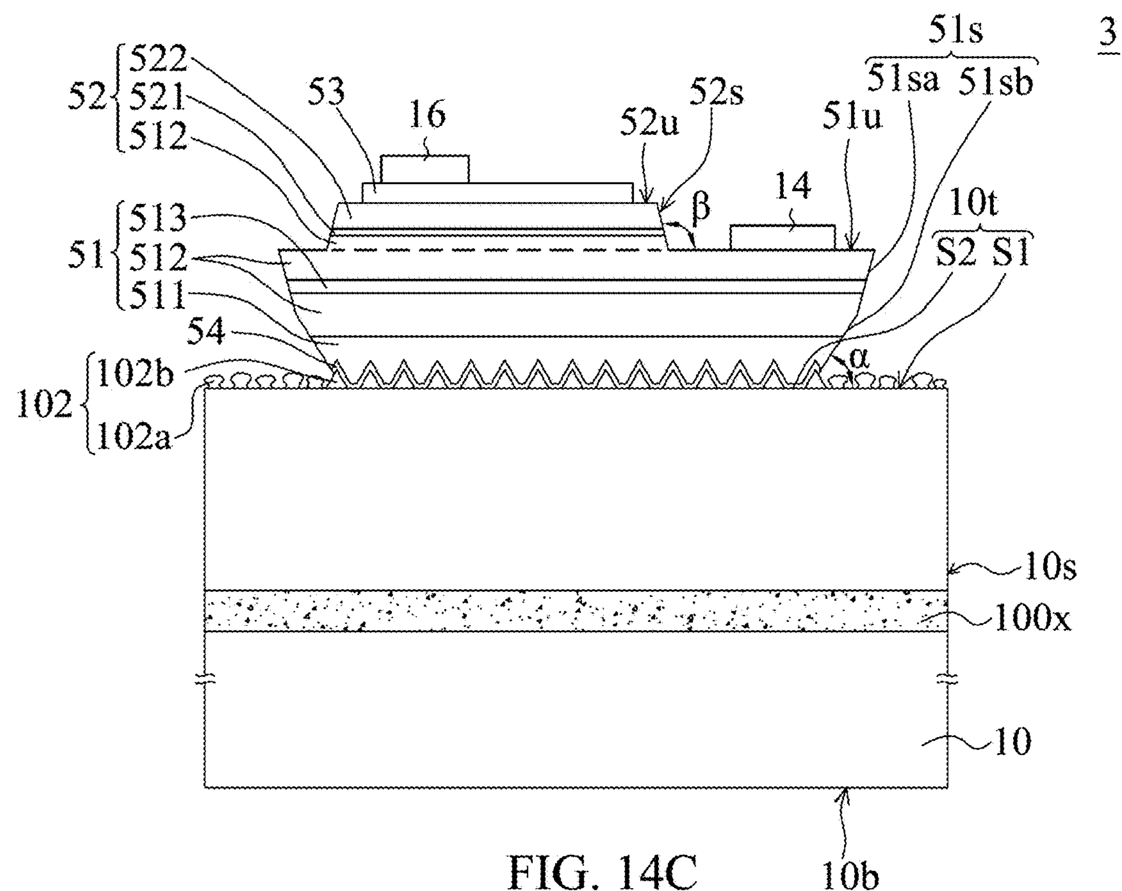

FIGS. 14~15 show a light-emitting device 3 in accordance with a third embodiment of the present disclosure, wherein a top-view of the light-emitting device 3 may be the same as the top-view of the light-emitting device 2 as shown in FIG. 9, and FIGS. 14A~14C respectively show a cross-sectional view of the light-emitting device 3 along a dotted line AA' of FIG. 9 according to different examples of the third embodiment. One of the differences between the light-emitting device 3 and the light-emitting device 2 is that the side surface 10*s* of the substrate 10 is directly connecting the top surface 10*t* in accordance with the present embodiment, which means the substrate 10 of the light-emitting device 3 of the third embodiment is devoid of the inclined surface 10*h* of the light-emitting device 2 of the second embodiment.

Figure 15A:
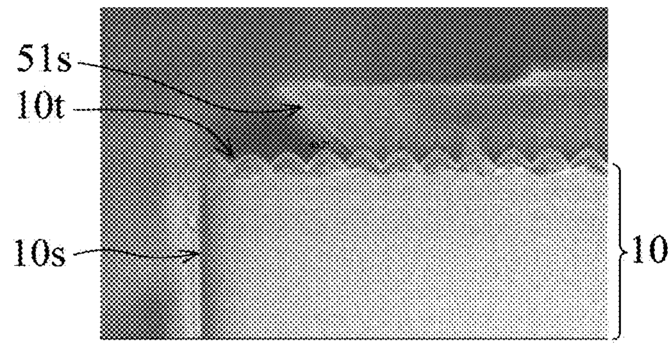
FIGS. 15A~15B show SEM diagrams of an area C and D of the third embodiment shown in FIGS. 14A and 14B.
Figure 15B:
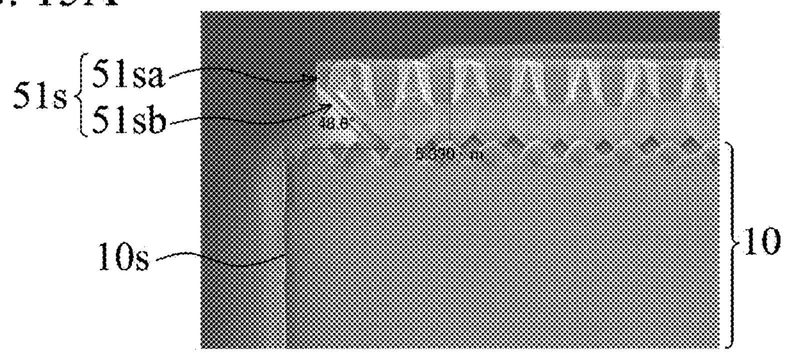

FIG. 15A shows a SEM diagram of an area C of the light-emitting device 3 shown in FIG. 14A, wherein the side surface 10*s* directly connects the top surface 10*t*. FIG. 15B shows a SEM diagram of an area D of the light-emitting device 3 shown in FIG. 14B, wherein the side surface 10*s* directly connects the top surface 10*t* and the upper first side wall 51*sa* is substantially parallel to the side surface 10*s*.

In addition, as shown in FIGS. 14A~14C, the side surface 10*s* comprises a damage region 100*x* on thereof, wherein the damage region 100*x* is rougher than the other portion of the side surface 10*s*.

Third Process Embodiment

Figure 16A:
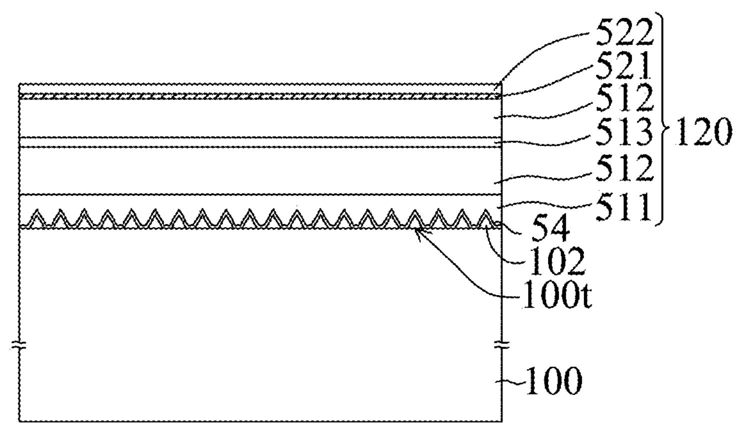
FIGS. 16A~16F show a manufacturing process of the light-emitting device in accordance with the third process embodiment of the present disclosure.
Figure 16B:
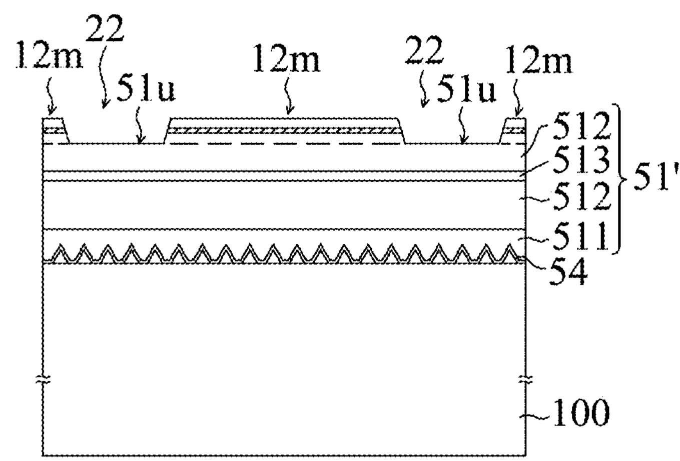
Figure 16C:
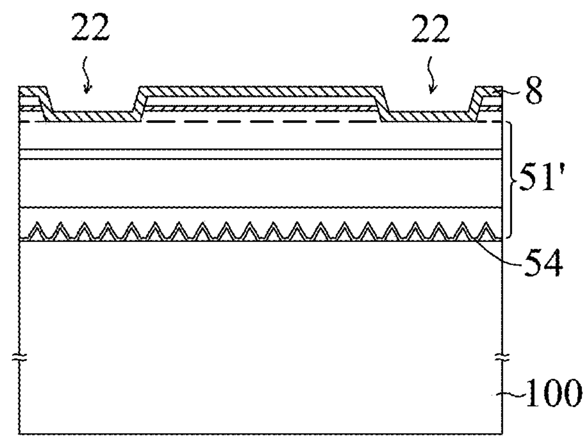
Figure 16D:
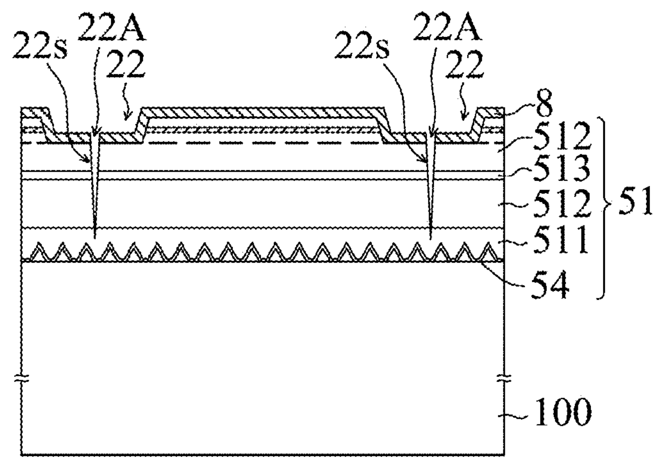
Figure 16E:
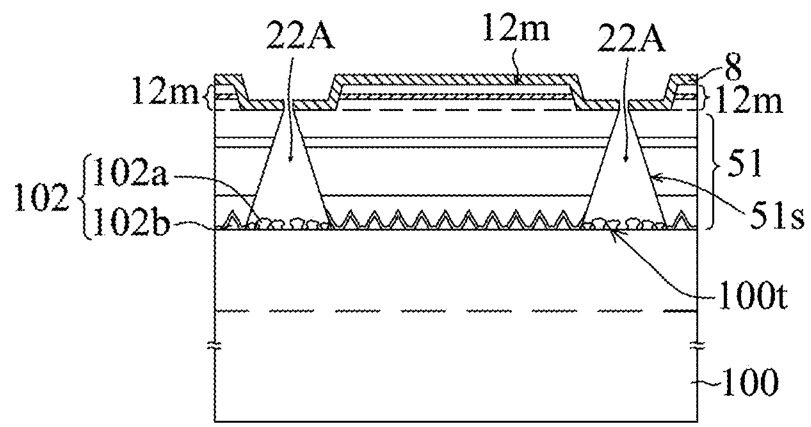

FIGS. 16A~16F show a manufacturing process of the light-emitting device 3 in accordance with the third process embodiment of the present disclosure, and a top view of FIG. 16D or 16E may be the same as the foregoing embodiment shown in FIG. 6, wherein FIGS. 16D and 16E shows a cross-section view along line A-A' of FIG. 6.

The process steps shown in FIGS. 16A~16C of the third process embodiment are basically the same as the process steps shown in FIGS. 10A~10C of the second process embodiment.

The difference between the present process embodiment and the foregoing process embodiment is that, as shown in FIG. 16D, a V-shape scribing region 22A is formed in the each trench 22 by laser dicing to remove a portion of the protective layer 8 and divide the semiconductor stack 51' into multiple first semiconductor stacks 51, wherein each of the first semiconductor stacks 51 has the light-emitting section 12*m* on thereof. During the laser process, a laser beam is provided to focus in the semiconductor stack 51', and the power of the laser beam is controlled to decide the depth of the V-shape scribing region 22A. In one example, the bottom of the V-shape scribing region 22A exposes the concavo-convex structures 102 of the growth wafer 100. In another example, the bottom of the V-shape scribing region 22A only exposes the undoped layer 511 or the first doped layer 512.

Next, as shown in FIG. 16E, a wet etch step is provided, and then each of the first semiconductor stacks 51 has a first side wall 51*s*, which is not perpendicular to the top surface 100*t* of the growth wafer 100, and a portion of the top surface 100*t* is exposed from the buffer layer 54. In the wet etch step, an etching solution is provided into the V-shape scribing region 22A to remove a portion of each of the first semiconductor stacks 51 for forming the first side wall 51*s* and etch a portion of the concavo-convex structures 102 under the V-shape scribing region 22A for forming the concavo-convex structures 102*a*, which have smaller sizes than the concavo-convex structures 102*b* under the buffer layer 54. The angle between the first side wall Ms and the top surface 100*t* exposed from the buffer layer 54 is controlled by the ingredient of the etching solution, etching time and temperature. In the embodiment, the etching solution comprises sulfuric acid, phosphoric acid, hydrochloric acid, hydrofluoric acid or the combination thereof. In addition, for avoiding over etching the buffer layer 54 or other lower layer of the light-emitting section to prevent from the first semiconductor stacks 51 near the first side wall Ms collapsing, the etching time may be selected from 10~30 minutes or larger than 30 minutes and the etching temperature may be selected from 200~250° C. or 250~300° C. Preferably, when the material of the buffer layer 54 comprises AlN, the etching temperature is 200~250° C. and the etching time is 10~30 minutes. Preferably, when the material of the buffer layer 54 comprises GaN, the etching temperature is 250~300° C. and the etching time is larger than 30 minutes.

In one example after the wet etch step, the first side wall Ms and the top surface 100*t* exposed from the buffer layer 54 form an acute angle $\alpha$ between thereof, wherein $30° \leq \alpha \leq 80°$. And, the concavo-convex structures 102*a* of the growth wafer 100 exposed from the buffer layer 54 have smaller sizes, such as height and/or diameter, than the sizes of the concavo-convex structures 102*b* under the buffer layer 54.

Figure 16F:
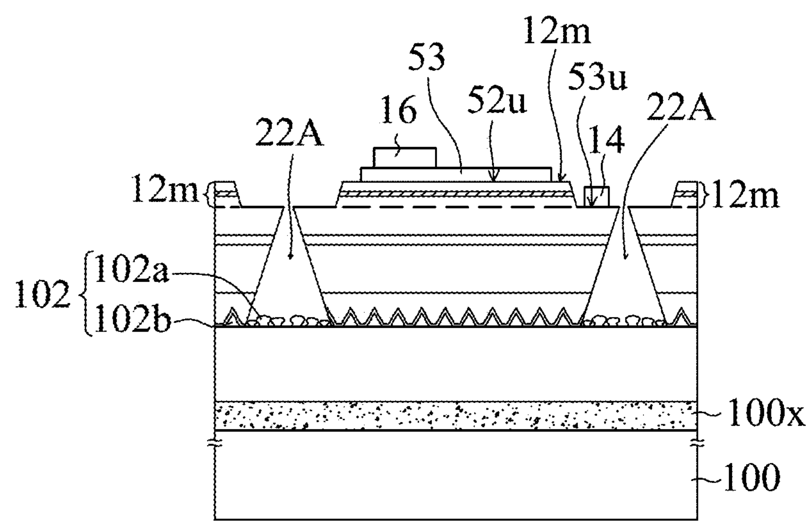

Then, as shown in FIG. 16F, the protective layer 8 is removed to expose multiple first upper surfaces 51*u* of the first semiconductor stacks 51 and multiple second upper surfaces 52*u* of the light-emitting sections 12*m*. The transparent conductive layer 53 is formed on the second upper surface 52*u*. The first electrode 14 is formed on the exposing portion of the first upper surface 51*u*, and the second electrode 16 is formed on the transparent conductive layer 53.

Then, the growth wafer 100 is divided or removed by laser dicing, physical breaking, or combination thereof. In one embodiment, a laser beam is provided to focus in the growth wafer 100 to form a damage region 100*x* in the growth wafer 100, and a physical breaking process is provided to divide the growth wafer 100. The dividing position of the growth wafer 100 is corresponding to the V-shape scribing regions 22A. And then, the multiple first semiconductor stacks 51 and the light-emitting sections 12*m* are separated into multiple chips accordingly. Each of the chips comprises the substrate 10, the first semiconductor stack 51, the second semiconductor stack 52, the transparent conductive layer 53, the first electrode 14, and the second electrode 16 as previously described in the foregoing embodiments of the present disclosure. All the material, properties and functions of the chips are the same as the light-emitting device 3 described in the present disclosure. Therefore, the total internal reflection of the light emitted from the active layer 521 of the light-emitting device 2 is reduced by the inclined first side wall 51*s*, and the light extraction efficiency is improved.

Application Embodiment

Figure 11:
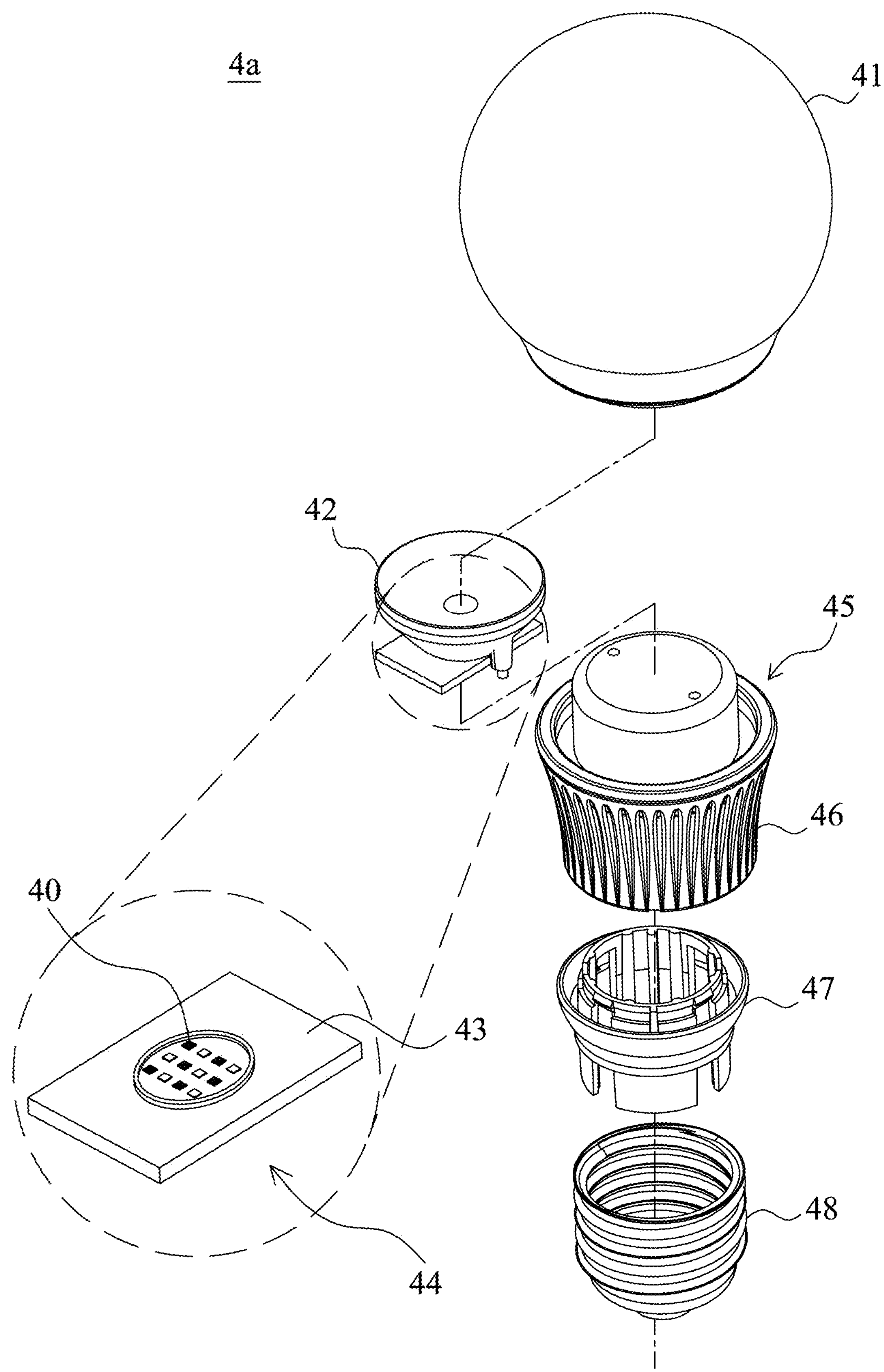
FIG. 11 illustrates an explored view of an optoelectronic system in accordance with an embodiment of the present disclosure.

Due to advantages of the light emitting device in accordance with the foregoing embodiments of the present disclosure, the light emitting device may be further incorporated within an optoelectronic system such as illumination apparatus, display, projector, or indicator. As shown in FIG. 11, an optoelectronic system 4*a* includes a cover 41, an optical element 42 in the cover 41, a light-emitting module 44 coupled with the optical element 42, a base 45 having a heat sink 46 for carrying the light-emitting module 44, a connection portion 47, and an electrical connector 48, wherein the connection portion 47 connects to the base 45 and the electrical connector 48. In an embodiment, the connection portion 47 may be integrated with the base 45 which means the connection portion 47 may be a part of the base 45. The light-emitting module 44 has a carrier 43 and a plurality of light-emitting devices 40 in accordance with the foregoing embodiments of the present disclosure on the carrier 43. The optical element may have a feature comprising refractor, reflector, diffuser, light guide or any combinations thereof, to direct light emitted from the light-emitting devices out of the cover 41 and perform lighting effects according to requirements for different applications of the optoelectronic system 4*a*.

Figure 12:
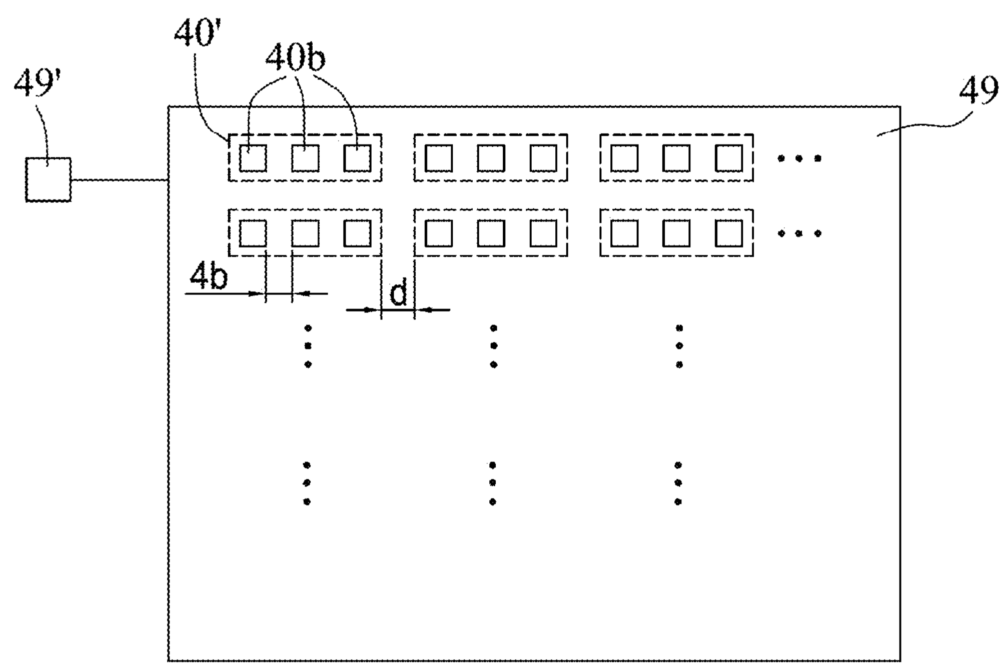
FIG. 12 illustrates another optoelectronic system in accordance with another embodiment of the present disclosure.

FIG. 12 illustrates another optoelectronic system 4*b*. The optoelectronic system 4*b* comprises a board 49, multiple pixels 40' on and electrically connecting the board 49, a control module 49' electrically connecting the board 49 to control the multiple pixel 40', wherein one of the multiple pixels 40' comprises one or more light-emitting devices 40*b* in accordance with the foregoing embodiments of the present disclosure, and the light-emitting devices 40*b* can be controlled by the control module 49' respectively. For example, the light-emitting devices 40*b* in one pixel 40' may comprise a first light-emitting device for emitting red light, a second light-emitting device for emitting blue light and/or a third light-emitting device for emitting green light. The light-emitting devices 40*b* may be disposed as a matrix with columns and rows, or be dispersed regularly or irregularly on the board 49. In an embodiment, preferably, a distance d between any two adjacent pixels 40' is between about 100 μm and 5 mm, and a distance d' between any two adjacent light-emitting devices 40*b* in one pixel 40' is between about 100 μm and 500 μm.

Figure 13:
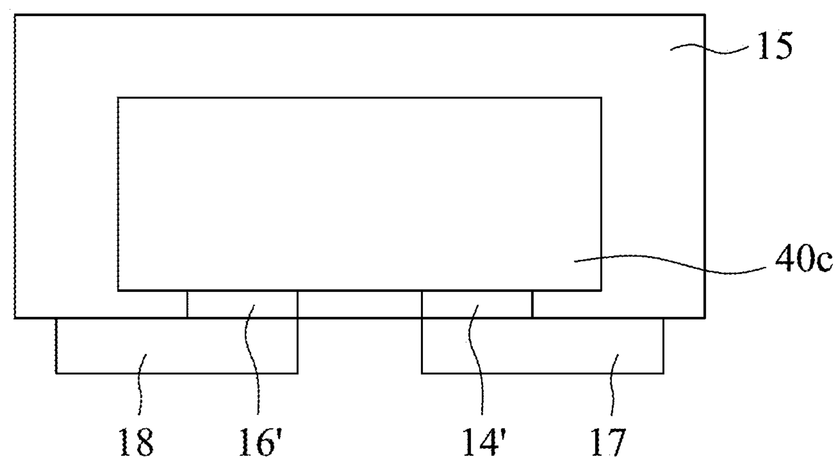
FIG. 13 illustrates a light engine in accordance with an embodiment of the present disclosure.

FIG. 13 illustrates a light-emitting unit 4*c*. The light-emitting unit 4*c* comprises a light-emitting device 40*c* in accordance with the foregoing embodiments of the present disclosure, two electrical connecting ends 16', 14' on the light-emitting device 40*c*, a wavelength conversion layer 15 covering the light-emitting device 40*c* and exposing the two electrical connecting ends 16', 14', and two bonding pads 17, 18 formed on and respectively connecting the electrical connecting ends 16', 14'.

It will be apparent to those having ordinary skill in the art that the foregoing embodiments alone or combinations thereof shall be a part of the present disclosure, and various modifications and variations can be made in accordance with the present disclosure without departing from the scope or spirit of the disclosure. In view of the foregoing, it is intended that the present disclosure cover combinations, modifications and variations of this disclosure provided they fall within the scope of the following claims and their equivalents.

What is claimed is:

1. A manufacturing method of a light-emitting device, comprising:

providing a substrate with a top surface, wherein the top surface comprises a plurality of concavo-convex structures;

forming a semiconductor stack on the top surface;

forming a trench in the semiconductor stack to define a plurality of second semiconductor stacks and expose a first upper surface;

forming a region which extends from the first upper surface into the semiconductor stack and exposes a side surface of the semiconductor stack to define a plurality of first semiconductor stacks;

removing a portion of the plurality of first semiconductor stacks and a portion of the concavo-convex structures trough the region to form a first side wall of each of the first semiconductor stack; and dividing the substrate along the region;

wherein the first side wall and the top surface form an acute angle $\alpha$ between thereof, $30° \leq \alpha \leq 80°$.

2. The manufacturing method according to claim 1, wherein the region is a scribing region.

3. The manufacturing method according to claim 2, wherein forming the scribing region comprises laser dicing.

4. The manufacturing method according to claim 1, further comprising forming a protective layer covering the plurality of second semiconductor stacks and the first upper surface.

5. The manufacturing method according to claim 4, wherein the protective layer comprises $SiO_x$, $SiN_x$ or a combination thereof.

6. The manufacturing method according to claim 1, wherein the method of forming the trench comprises dry etching.

7. The manufacturing method according to claim 1, wherein removing the portion of the plurality of first semiconductor stacks and the portion of the concavo-convex structures comprises wet etching.

8. The manufacturing method according to claim 1, wherein the region exposes the concavo-convex structures.

9. The manufacturing method according to claim 1, wherein dividing the substrate comprises providing a laser beam focusing in the substrate to form a damage region in the substrate.

10. The manufacturing method according to claim 1, wherein the second semiconductor stack has a second side wall connecting the first upper surface, and an obtuse angle $\beta$ is formed between the second side wall and the first upper surface, wherein $100° \leq \beta \leq 170°$.

11. The manufacturing method according to claim 1, further comprising forming a buffer layer on the substrate by physical vapor deposition process before forming the semiconductor stack on the substrate.

12. The manufacturing method according to claim 11, wherein the buffer layer comprises AlN.

13. The manufacturing method according to claim 1, further comprises forming a first electrode on the first semiconductor stack and a second electrode on the second semiconductor stack.

14. The manufacturing method according to claim 7, wherein the portion of the concavo-convex structures after being etched has smaller size than the concavo-convex structures under the first semiconductor stack.

15. The manufacturing method according to claim 3, wherein the scribing region further extends into the substrate.

16. A manufacturing method of a light-emitting device, comprising:

providing a substrate with a top surface, wherein the top surface comprises a plurality of concavo-convex structures;

forming a semiconductor stack on the top surface;

forming a trench in the semiconductor stack to define a plurality of second semiconductor stacks and expose a first upper surface;

forming a scribing region by a first laser dicing from the first upper surface to define a plurality of first semiconductor stacks;

etching a portion of the plurality of first semiconductor stacks trough the scribing region to form a first side wall of each of the first semiconductor stack; and dividing the substrate by a second laser dicing along the scribing region, wherein a second laser beam of the second laser dicing focuses in the substrate; and wherein the first side wall and the top surface form an acute angle $\alpha$.

17. The manufacturing method according to claim 16, wherein the scribing region further extends into the substrate to expose a side surface of the substrate.

18. The manufacturing method according to claim 17, further comprising etching the side surface of the substrate.

19. The manufacturing method according to claim 16, wherein the second laser beam forms a damage region in the substrate.

20. The manufacturing method according to claim 16, wherein $30° \leq \alpha \leq 80°$.

* * * * *